US008068574B2

(12) United States Patent
Norris et al.

(10) Patent No.: US 8,068,574 B2
(45) Date of Patent: Nov. 29, 2011

(54) SYSTEMS, APPARATUS, AND METHODS FOR PERFORMING DIGITAL PRE-DISTORTION WITH FEEDBACK SIGNAL ADJUSTMENT

(75) Inventors: George Norris, Gilbert, AZ (US); Joseph Staudinger, Gilbert, AZ (US); Jau-Horng Chen, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 897 days.

(21) Appl. No.: 11/755,960

(22) Filed: May 31, 2007

(65) Prior Publication Data
US 2008/0298500 A1 Dec. 4, 2008

(51) Int. Cl.
*H04L 7/00* (2006.01)
(52) U.S. Cl. ......... 375/358; 375/357; 375/356; 375/355
(58) Field of Classification Search .................. 375/290; 455/114.13
See application file for complete search history.

(56) References Cited

U.S. PATENT DOCUMENTS

| | | | |
|---|---|---|---|
| 5,699,383 A * | 12/1997 | Ichiyoshi | 375/297 |
| 6,252,733 B1 * | 6/2001 | Staszewski | 360/51 |
| 6,275,685 B1 * | 8/2001 | Wessel et al. | 455/126 |
| 6,617,932 B2 * | 9/2003 | Kushner et al. | 331/11 |
| 6,693,974 B2 | 2/2004 | Jin et al. | |
| 6,751,447 B1 * | 6/2004 | Jin et al. | 455/114.3 |
| 7,327,404 B2 * | 2/2008 | Chen et al. | 348/654 |
| 7,602,244 B1 * | 10/2009 | Holmes et al. | 330/149 |
| 2002/0097811 A1 * | 7/2002 | Kubo et al. | 375/296 |
| 2003/0038682 A1 * | 2/2003 | Kushner et al. | 331/11 |
| 2004/0121741 A1 * | 6/2004 | Rashev et al. | 455/114.3 |
| 2004/0198268 A1 * | 10/2004 | Rashev et al. | 455/126 |
| 2005/0073361 A1 * | 4/2005 | Hamada et al. | 330/149 |
| 2005/0085199 A1 | 4/2005 | Khan et al. | |
| 2005/0249321 A1 * | 11/2005 | Dawson et al. | 375/354 |
| 2005/0253745 A1 * | 11/2005 | Song et al. | 341/118 |
| 2006/0226903 A1 * | 10/2006 | Muller et al. | 330/149 |
| 2007/0057737 A1 * | 3/2007 | Davis et al. | 331/17 |
| 2007/0273416 A1 * | 11/2007 | Heyne | 327/158 |
| 2008/0129406 A1 * | 6/2008 | Nergis | 332/127 |
| 2008/0144709 A1 * | 6/2008 | McCallister et al. | 375/233 |
| 2008/0285640 A1 * | 11/2008 | McCallister et al. | 375/233 |
| 2008/0298500 A1 * | 12/2008 | Norris et al. | 375/296 |
| 2009/0111399 A1 * | 4/2009 | Norris et al. | 455/114.3 |

OTHER PUBLICATIONS

Muhonen, K., et al., Look-up table techniques for adaptive digital predistortion: A development and comparasion, IEEE Transactions on Vehicular Technology, vol. 49, No. 5, Sep. 2000.
Digital Predistortion Reference Design, Application Note AN-314-1.0, Jul. 2003, Altera Corporation, pp. 1-46.
International Search Report and Written Opinion for correlating PCT Patent Application No. PCT/US2008/063369 dated Jul. 23, 2008.

* cited by examiner

*Primary Examiner* — Chieh M Fan
*Assistant Examiner* — Santiago Garcia
(74) *Attorney, Agent, or Firm* — Ingrassia Fisher & Lorenz, PC

(57) ABSTRACT

In an embodiment, a digital pre-distortion apparatus processes an input signal to produce a pre-distorted signal, and processes the pre-distorted signal to produce a feedback signal. The apparatus also rotates an adjustment gain by a gain rotation angle to produce a rotated adjustment gain, where the gain rotation angle is based on a phase difference between the input signal and the feedback signal. The apparatus also applies the rotated adjustment gain to the feedback signal, which may result in rotation of the feedback signal into a target phase region.

20 Claims, 5 Drawing Sheets

SYSTEMS, APPARATUS, AND METHODS FOR PERFORMING DIGITAL PRE-DISTORTION WITH FEEDBACK SIGNAL ADJUSTMENT

TECHNICAL FIELD

Embodiments of the inventive subject matter relate to digital pre-distortion systems, apparatus, and methods, and more particularly to digital pre-distortion with feedback signal adjustment.

BACKGROUND

Some electronic systems include devices (e.g., radio frequency (RF) power amplifiers), which add distortion to a signal during processing. Such devices are referred to as "non-linear" devices when the added distortion is non-linear in nature. Distortion may include, for example, variations in phase differences and/or variations in amplitude differences. For example, one type of non-linearity occurs when the phase between the input and output signals varies with input signal amplitude. This is generally referred to as amplitude-to-phase distortion (am/pm). Another type of non-linearity occurs when the ratio of output signal amplitude to input signal amplitude varies with input signal amplitude. This is generally referred to as amplitude-to-amplitude distortion (am/am). Significant distortion, left uncompensated for, may result in poor signal quality.

Digital pre-distortion (DPD) systems have been used in the past to compensate for the intrinsic distortion characteristics of non-linear devices. A traditional DPD system determines an error signal, which reflects differences between an input signal and a feedback signal from the system output. "Insertion phase" is a term used to describe a quantity representing an average difference in phase between the input signal and the feedback signal, or equivalently, the average phase of the error signal. The error signal is used to determine a complementary distortion or inverse gain signal. The inverse gain signal, which inversely reflects the error signal, is combined with the input signal to produce a "pre-distorted" signal. In many cases, this process results in effective cancellation of the distortion (i.e., the non-linearities) produced within the system, and a more linear output signal may result.

Lookup tables have been used to store inverse gain values. In some traditional DPD systems, an initialization and training process is performed prior to transmission of actual input data, in order to determine the inverse gain values within the lookup table. Using this process, a training sequence is applied to the system, during which time the inverse gain values are adapted to reflect the system's distortion characteristics. After completion of the training process, actual input data is then combined with the adapted inverse gain values, and the combined signal is transmitted. In other traditional DPD systems, a training process is not performed. Instead, the inverse gain values in the lookup table are set to pre-defined, "blind" settings. The blind settings do not reflect the actual, then-current distortion characteristics, but instead reflect a pre-defined estimate of the distortion characteristics. At the onset of a transmission burst, the blind settings are applied to the actual input data to attempt to compensate for the distortion. Eventually, the inverse gain values may adapt to more accurately reflect the actual distortion characteristics.

The prior DPD systems described above suffer from several drawbacks. In particular, using prior DPD systems, when an error signal reflects a significant insertion phase (e.g., at the onset of a transmission), convergence to an acceptable pre-distorted signal may take a long time to occur. In some situations, convergence may not occur at all. In addition, DPD systems that use training processes may add considerable complexity, hardware, and cost to transmitter systems. In addition, timing issues (e.g., issues relating to the burst/slot/frame structure) may preclude the use of training processes. Although, DPD systems that use "blind" settings of initial lookup table values may overcome some of these disadvantages, they suffer from other disadvantages. For example, the linearization performance of these DPD systems are strongly coupled to the choice of initial inverse gain values in the lookup table. In environments in which the distortion characteristics are not well known and/or change considerably with environmental conditions and/or transmitter operation, poor initial performance may result from inaccurate initial inverse gain values. In some cases, when the initial inverse gain values are substantially inaccurate, the system may not be able to converge at all. For at least the above reasons, a need exists for DPD systems and methods that provide relatively fast convergence to an acceptable pre-distorted signal, even in the face of relatively large insertion phases.

DETAILED DESCRIPTION

Embodiments described herein include methods and apparatus for performing digital pre-distortion in a system that includes a lookup table. Embodiments described herein also include methods and apparatus for performing phase rotations to an adjustment gain applied to a feedback signal in order potentially to decrease the time and to increase the likelihood of convergence, even when the feedback signal includes a relatively large insertion phase. Embodiments described herein also include methods and apparatus for initializing and updating a lookup table of a digital pre-distortion apparatus.

The various embodiments may provide one or more advantages over traditional digital pre-distortion systems. For example, embodiments of the inventive subject matter provide systems, apparatus and methods adapted to rapidly decrease relatively large insertion phases within a feedback signal by rotating an adjustment gain, which is applied to the feedback signal. In addition, embodiments of the inventive subject matter may perform adjustment gain rotation based on actual input data samples, rather than based on training sequences, which may avoid adding complexity, hardware, and cost to a system, and also may avoid issues that may preclude the use of training sequences. Further, embodiments of the inventive subject matter may provide better linearization performance, decreased time to convergence, and an increased likelihood of convergence over traditional systems that use blind settings of initial lookup table values, particularly in environments in which relatively large insertion phases are present, and/or in systems having distortion characteristics that are not well known and/or change considerably with environmental conditions and/or transmitter operation.

Figure 1:
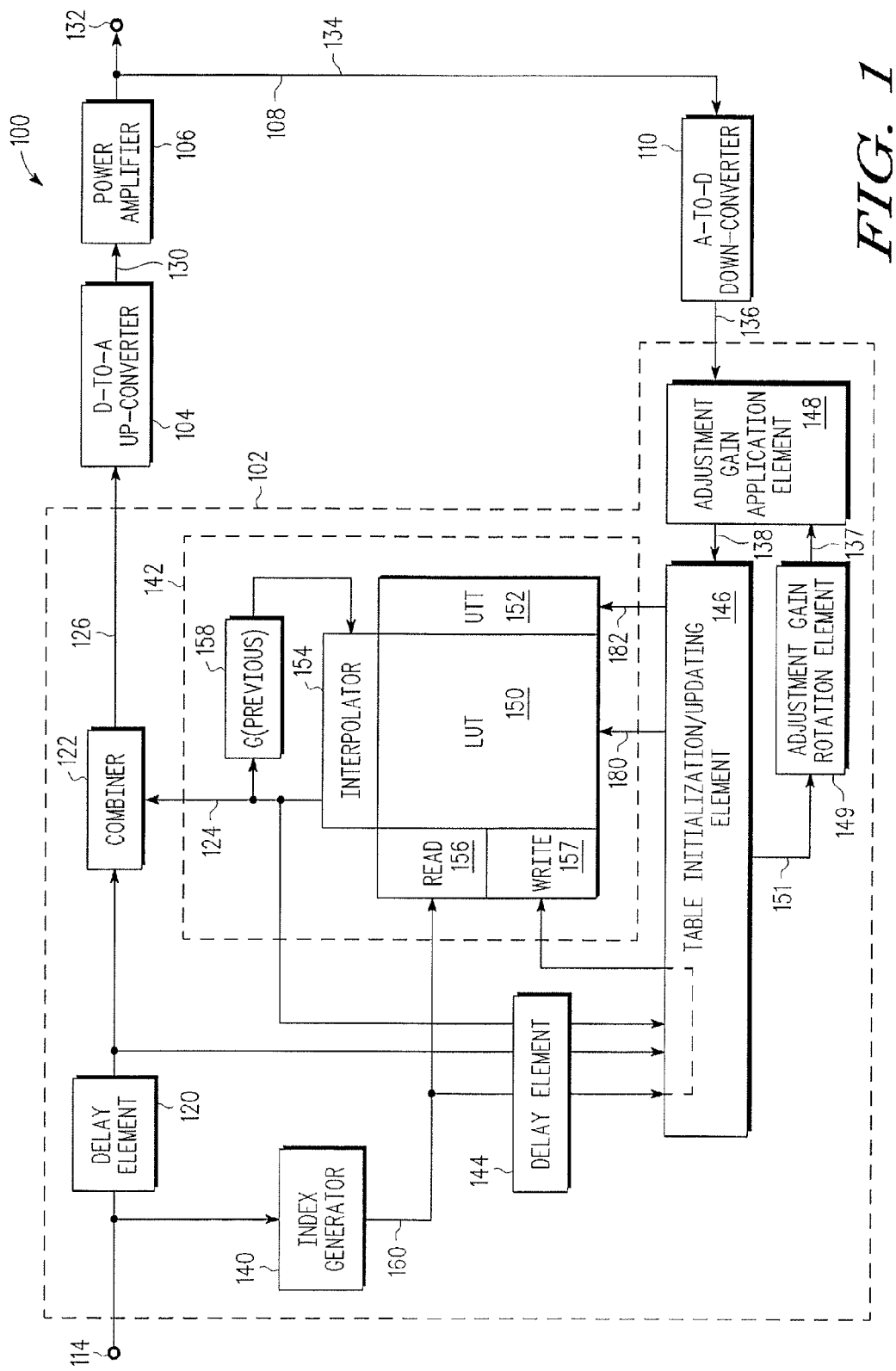
FIG. 1 illustrates a simplified block diagram of an electronic system having a digital pre-distortion (DPD) apparatus, in accordance with an example embodiment of the inventive subject matter.

FIG. 1 illustrates a simplified block diagram of electronic system 100 having a digital pre-distortion (DPD) apparatus 102, in accordance with an example embodiment of the inventive subject matter. Electronic system 100 may form a portion of any apparatus that is includes a DPD apparatus, including but not limited to apparatus that transmit signals over a wireless medium. These apparatus include, but are not limited to, a cellular telephone, a radio, a two-way pager, a personal data assistant, a computer (e.g., a laptop or desktop computer), a satellite, a relay, a repeater, a stereo amplifier, a remote control device, a wireless transmitter, and/or a wireless transceiver, to name a few.

Electronic system 100 includes DPD apparatus 102, digital-to-analog (D-to-A) converter and frequency up-converter 104 (herein "up-converter 104"), power amplifier 106, feedback path 108, and analog-to-digital (A-to-D) converter and frequency down-converter 110 (herein "down-converter 110"), in an embodiment. These system elements form at least a portion of a transmit path and a feedback path for electronic system 100. Electronic system 100 may include additional system elements (not illustrated) such as, for example, one or more input data sources, receive path system elements, signal processing components, data storage components, and/or user interfaces, to name a few. For purposes of clarity only, these additional system elements are not illustrated in FIG. 1. Further, although FIG. 1 illustrates a DPD apparatus 102 used in the context of a transmit path for an electronic system, DPD apparatus of various embodiments may alternatively be used in a receive path for an electronic system, and/or within other electronic systems that include one or more amplifiers and/or other non-linear devices for which digital pre-distortion may be desired. Accordingly, the scope of the inventive subject matter is intended to include DPD apparatus used in a variety of different types of systems.

DPD apparatus 102 receives an input signal that includes multiple input data samples 114, X(k). As used herein, the term "input signal" means a sequence of one or more input data samples 114. Input data samples 114 may include, for example, a sequence of discrete time samples of a signal to be transmitted (e.g., a transmission burst). In an embodiment, input data samples 114 include a sequence of complex values represented in Cartesian coordinates, so that each value has a real part (I) and an imaginary part (Q). Accordingly, input data samples 114 may include a sequence of values that may be represented as X(k)=[I(k), Q(k)], where k indicates a sample number and k=1 . . . K, I(k) represents a real part of an input data sample, and Q(k) represents an imaginary part of an input data sample. In alternate embodiments, input data samples 114 may include sequences of values represented in polar coordinates or some other representation.

Figure 2:
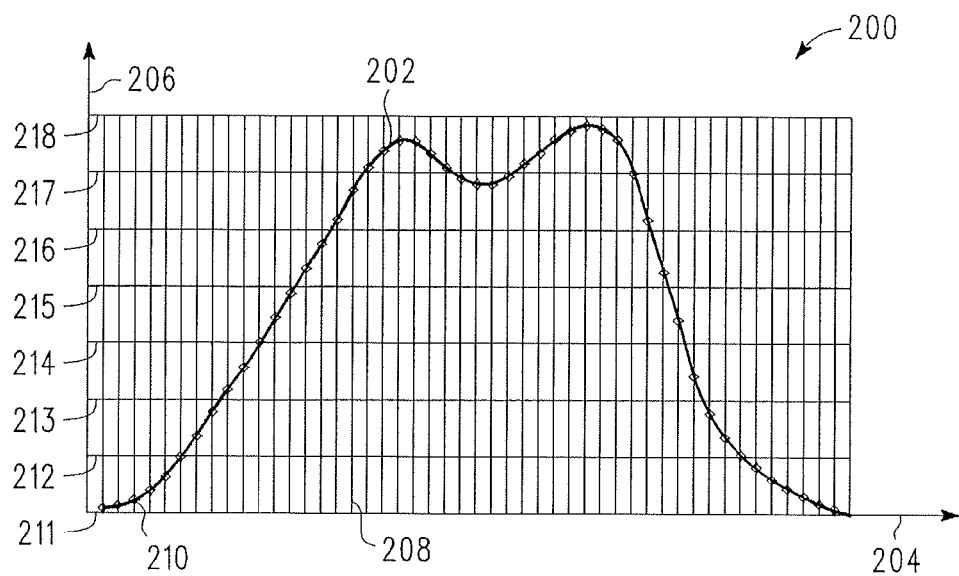
FIG. 2 illustrates a representation of a sampled input signal, in accordance with an example embodiment.

FIG. 2 is a graph 200 illustrating a sampled input signal 202 (e.g., from which input data samples 114, FIG. 1 may be determined), in accordance with an example embodiment. Input signal 202 could represent, for example, a signal burst produced using any of a number of technologies, including GSM (Global System for Mobile communications, or Groupe Special Mobile), EDGE (Enhanced Data rates for GSM Evolution), TDMA (Time-Division Multiple Access), CDMA (Code Division Multiple Access), W-CDMA (Wireless CDMA) or some other technology. Graph 200 includes a time axis 204 and a magnitude axis 206, and accordingly variation in the input signal magnitude with respect to time is represented in FIG. 2. For example, magnitude axis 206 could correspond to the vector magnitude of X(k), in an embodiment, although magnitude axis 206 alternatively could correspond to the magnitude of I(k) or Q(k), in other embodiments. Vertical lines 208 indicate sampling moments, and samples 210 are indicated by diamonds along input signal 202. For purposes of illustration, only 48 samples 210 are indicated for input signal 202. In actuality, significantly more samples may be produced (e.g., millions), depending on the sampling rate of the system. Horizontal lines indicate magnitude thresholds 211, 212, 213, 214, 215, 216, 217, 218. As will be described in detail later, each magnitude threshold 211-218 may correspond to an entry within a lookup table 150 (FIG. 1).

Referring again to FIG. 1, in an embodiment, DPD apparatus 102 includes first delay element 120, combiner 122, index generator 140, gain generator 142, second delay element 144, table initialization/updating element 146, adjustment gain application element 148, and adjustment gain rotation element 149. Gain generator 142 includes lookup table 150 (LUT), update tracking table 152 (UTT), interpolator 154, read logic 156, and write logic 157, in an embodiment. In addition, gain generator 142 also may include a previous gain register 158 or a memory location for storing a previous gain, G(previous), as will be described in more detail later.

First delay element 120 is adapted to delay an input data sample 114, X(k), by period of time (e.g., a number of clock cycles) corresponding to the amount of time it takes for DPD apparatus 102 to produce an appropriate output gain 124, G(k), for combination with the input data sample 114. Combiner 122 is adapted to combine the delayed input data samples 114 with the gains 124, in order to produce pre-distorted data samples 126, $X_p(k)$. Details regarding production of gains 124 will be described in detail in subsequent paragraphs. In an embodiment, each output gain 124 includes a complex value represented in Cartesian coordinates. For example, a complex output gain 124 may be represented as $G(k)=[G_r(k),G_i(k)]$, where G(k) is a complex gain to be applied to the $k^{th}$ input data sample, X(k). $G_r(k)$ represents a real component of the complex gain, and $G_i(k)$ represents an imaginary component of the complex gain. In other embodiments, each gain may be represented in polar coordinates or some other gain representation. In an embodiment, the combination of the input data samples 114 with the gains 124 (i.e., the pre-distorted data samples 126) may be represented as $X_p(k)=(I(k)+jQ(k))\times(G_r(k)+jG_i(k))=[I_p(k), Q_p(k)]$. $I_p(k)$ represents the real part of a pre-distorted data sample 126, and $Q_p(k)$ represents an imaginary part of a pre-distorted data sample 126.

Up-converter 104 is adapted to receive and perform a D-to-A conversion of the pre-distorted data samples 126. In an embodiment, up-converter 104 also is adapted to up-convert the analog version of the pre-distorted data samples 126 from a first frequency (e.g., a baseband or intermediate frequency) to a second frequency (e.g., a carrier frequency). Up-converter 104 also may be adapted to perform filtering and/or pre-amplification, in an embodiment. Up-converter 104 produces an up-converted analog signal 130. Power amplifier 106 is adapted to receive and amplify the up-converted analog signal 130, and to produce an amplified analog signal 132, which may be transmitted by transmit subsystem (not illustrated) or otherwise processed. Transmission may occur over a wired or wireless communications medium.

During system operations, up-converter 104 and/or power amplifier 106 may introduce a significant amount of non-linearity (i.e., distortion) into the amplified analog signal 132, and may also add additional phase to the signal, which represents a phase rotation of the amplified analog signal 132, with respect to the input signal 114. In addition, the distortion produced by up-converter 104 and/or power amplifier 106 may change over time based on a variety of factors. For example, but not by way of limitation, factors affecting distortion may include transmission frequency, modulation scheme, temperature, physical position, and/or transmission power, among other things. As used herein, the term "non-linear device" refers to any device that has intrinsic distortion characteristics such that the device may introduce non-linear distortion into a signal that is processed by the device. Up-converter 104 and power amplifier 106 may be considered non-linear devices, in the illustrated embodiment. One or more other non-linear devices may be present in a signal path as well, including additional amplifiers, filters, converters, and/or other devices. Distortion may be further exacerbated by antenna loading and by processing performed along a feedback path. The term "cumulative signal distortion" refers to the combined distortion that may be applied to a signal by one or more non-linear devices of a system.

Gain generator 142 is adapted to generate a sequence of output gains 124, so that combination of the output gains 124 with the input data samples 114 pre-distorts the samples in a manner that mitigates the distortion produced by one or more non-linear devices (e.g., up-converter 104 and/or power amplifier 106) within system 100. In an embodiment, the output gains 124 are generated based on entries within a lookup table 150 (LUT), which will be described in detail later, and gain generator 142 is further adapted to maintain lookup table 150. The entries within the lookup table 150 may be initialized and updated, according to various embodiments, so that they may accurately compensate for the intrinsic distortion characteristics of the non-linear devices. In an embodiment, as will be described in detail later, the amplified analog signal 132 is fed back (e.g., via feedback path 108), processed and evaluated in order to generate gains within lookup table 150.

To enable processing and evaluation of the amplified analog signal 132, feedback path 108 is adapted to provide, to down-converter 110, a feedback analog signal 134 that represents the amplified analog signal 132. In an embodiment, down-converter 110 is adapted to down-convert the feedback analog signal 134 to the frequency of the input data samples 114 (e.g., a baseband or intermediate frequency). Down-converter 110 may be further adapted to perform filtering and/or amplification of the feedback analog signal 134, as well as performing an A-to-D conversion of the down-converted feedback signal 134. Down-converter 110 produces down-converted, feedback data samples 136, which may be referred to herein as "feedback samples." As used herein, the term "feedback signal" means a sequence of one or more down-converted, feedback samples 136. In an embodiment, feedback samples 136 include a sequence of complex values represented in Cartesian coordinates. Accordingly, feedback samples 136 may include a sequence of values that may be represented as $X_d(k)=[I_d(k), Q_d(k)]$, where $I_d(k)$ represents a real part of a feedback sample 136, and $Q_d(k)$ represents an imaginary part of a feedback sample 136. In alternate embodiments, feedback samples 136 may include sequences of values represented in polar coordinates or some other representation. In still other embodiments, a system or apparatus may have feedback configurations other than the configuration illustrated in FIG. 1. For example, but not by way of limitation, other embodiments may exclude an up-converter/down-converter in the feedback path, and/or other configurations may include more, fewer or different elements in the feedback loop than up-converter 104, power amplifier 106, and down-converter 110.

Feedback samples 136 are received by adjustment gain application element 148, in an embodiment. As will be described in detail later, in various embodiments, adjustment gain application element 148 is adapted to apply an adjustment gain (e.g., adjustment gain 137) to the feedback samples 136, $X_d(k)$, in order to substantially remove, from the feedback signal, various predictable gains that may have been applied along the transmit path. In an embodiment, an "adjustment gain" may be defined as an inverse of one or more gains applied along the transmit path, which have values that are known in advance by the system (e.g., gains applied by power amplifier 106 to control transmit power). Adjustment gains 137 may include a sequence of values that may be represented as $<S>^{-1}=<S_r(k)+jS_i(k)>^{-1}$, where $S_r(k)$ represents a real part of an adjustment gain 137, and $S_i(k)$ represents an imaginary part of an adjustment gain 137. In alternate embodiments, adjustment gains 137 may include sequences of values represented in polar coordinates or some other representation. Application of the adjustment gains 137 to the feedback samples 136 produces adjusted feedback samples 138, $X_{adj}(k)$.

Adjustment gain rotation element 149 is adapted to apply phase rotations to the adjustment gain, under some circumstances, and to provide the adjustment gains 137 to the adjustment gain application element 148. Adjustment gain application element 138 is adapted to apply the adjustment gains 137 to the feedback samples 136, to produce adjusted feedback samples 138, $X_{adj}(k)$. In an embodiment, application of the adjustment gains 137 to the feedback samples 136 may be represented as:

$$X_{adj}(k)=[I_{adj}(k), Q_{adj}(k)]=X_d(k) \times <S(k)>^{-1}=(I_d(k)+jQ_d(k)) \times <S_r(k)+jS_i(k)>^{-1},$$

where $I_{adj}(k)$ represents a real part of an adjusted feedback sample 138, and $Q_{adj}(k)$ represents an imaginary part of an adjusted feedback sample 138.

Table initialization/updating element 146 is adapted to receive and phase rotate the input data sample 114, $X(k)$, and the corresponding adjusted feedback sample 138, $X_{adj}(k)$, in an embodiment, to produce a rotated input data sample, $X_{rot}(k)$, and a rotated, adjusted feedback sample, $X_{rot-adj}(k)$, respectively. For example, table initialization/updating element 146 may include a dual phase rotation element (e.g., dual phase rotation element 420, FIG. 4), which is adapted to phase rotate the input data sample 114 and the adjusted feedback sample 138 by a phase rotation value sufficient to substantially eliminate the phase of the input data sample 114. The remaining phase reflected in the rotated, adjusted feedback sample indicates uncompensated-for insertion phase in the system. In an embodiment, table initialization/updating element 146 is adapted to output an input/feedback phase difference indicator 151, which indicates the uncompensated-for insertion phase. The input/feedback phase difference indicator 151 is the rotated, adjusted feedback sample, in an embodiment. In other embodiments, the input/feedback phase difference indicator 151 may be some other value, such as an error vector, $E(k)$, a phase value, and/or some other information that indicates the input/feedback phase difference between the input data sample 114 and the corresponding adjusted feedback sample 138 (or the feedback sample 136).

Table initialization/updating element 146 is also adapted to evaluate the adjusted feedback samples 138 in the process of determining updates to the entries of lookup table 150. In the process of determining updates to entries of lookup table 150, table initialization/updating element 146 is adapted to determine an error vector, E(k), as a function of the input data sample 114, X(k), and the corresponding adjusted feedback sample 138, $X_{adj}$(k) (e.g., the difference between the input data sample 114 and the corresponding adjusted feedback sample 138). When the error vector has a relatively small phase component (e.g., <±22.5°), the system may converge fairly quickly. However, when the error vector has a relatively large phase component (e.g., >±22.5°), indicating a relatively large, uncompensated-for insertion phase within the system, the system may converge more slowly, or may not converge at all.

Adjustment gain rotation element 149 is adapted to apply a phase rotation to the adjustment gain, in an embodiment, in order to compensate for relatively large, uncompensated-for insertion phases. In an embodiment, adjustment gain rotation element 149 is adapted to receive the input/feedback phase difference indicator 151 from the table initialization/updating element 146. In an embodiment, when evaluation of the input/feedback phase difference indicator 151 indicates a relatively large, uncompensated-for insertion phase, adjustment gain rotation element 149 determines and applies a phase rotation to the adjustment gain, to produce the adjustment gains 137. As will be described in more detail later, a "target phase region" may be defined within the system for the input/feedback phase difference indicator 151. While adjustment gain rotation element 149 performs phase rotation of the adjustment gain, application of the adjustment gains 137 by adjustment gain application element 148 may result in the production of adjusted feedback samples 138 that may result in an effective rotation of the input/feedback phase difference indicator 151 into the target phase region. The concept of a target phase region will be described in more detail in conjunction with FIG. 3, later.

In an embodiment, updates to the entries of lookup table 150 are disabled or suspended while phase rotations are being applied to the adjustment gain. After a brief description of the lookup table 150 and how it is used within the system 100, the process of initializing and updating the entries of the lookup table 150 based on the error vector, E(k), will be described in more detail.

Lookup table 150 includes a plurality of entries, LUT(1 . . . N), and each lookup table entry may include a lookup table gain. In an embodiment, the number of lookup table entries, N, may be in a range from 4 to 32, although lookup table 150 may include more or fewer entries, in other embodiments. The number of lookup table entries, N, may be a static number or may be variable, in various embodiments. Each entry, LUT(n), within lookup table 150 may include a complex gain represented in Cartesian coordinates. For example, a complex gain within lookup table 250 may be represented as LUT(n)=[$LUT_r$(n), $LUT_i$(n)], where LUT(n) is a complex gain, n is an index into the lookup table, and n=1 . . . N. $LUT_r$(n) represents a real component of the complex gain, and $LUT_i$(n) represents an imaginary component of the complex gain. In other embodiments, each entry may include a value represented in polar coordinates or some other gain representation. In still other embodiments, a lookup table may be adapted to store a first value (e.g., an initial value) and a delta value for each entry, rather than a complex gain value. In such an embodiment, the system may maintain the first value and may change the delta value when a particular entry is being updated. To perform pre-distortion, the first value and the delta value may be combined with an input data sample (e.g., input data sample 114, FIG. 1). In still another embodiment, such as one that includes a lookup table with gains stored in polar coordinates (e.g., gain and phase), the lookup table may include more phase values stored therein than gains.

Interpolator 154 is adapted to calculate the output gain 124, G(k), which will be combined with the delayed input data sample, X(k). In various embodiments, interpolator 154 is adapted to produce the output gain 124, G(k), by performing a weighted interpolation process using lookup table gains stored within two consecutive lookup table entries, where the lookup table entries are determined based on an index 160, i(k), which is generated by index generator 140. As will be described in more detail later, in an embodiment, interpolator 154 may calculate the output gain 124, G(k), using a previously produced gain, G(previous), which may be stored in previous gain register 158 or a memory location. In an embodiment, the previously produced gain, G(previous), is an output gain that was produced for a "last" input data sample, or G(previous)=G(k−1). In other embodiments, the previously produced gain, G(previous), may be an output gain from some other, earlier output gain, or may be a value derived from multiple, previously produced output gains (e.g., an average or weighted average of multiple previously produced output gains). The processes of generating an index, i(k), and calculating an output gain 124, G(k), are described in detail in the next paragraphs.

Upon receipt of an input data sample 114 (e.g., a $k^{th}$ input data sample), index generator 140 may generate an index 160, i(k), into lookup table 150 for the $k^{th}$ input data sample. In various embodiments, the generated index may be determined based on, for example, the vector magnitude of X(k), or the vector magnitude squared of X(k) for an input data sample 114. For purposes of explanation, the description below refers to generating the index based on a magnitude of X(k), such as is represented in FIG. 2. A lookup table index 160, i(k), includes a fixed point number, in an embodiment, and accordingly has an integer part, $i_{INT}$(k), and a fractional part, $i_{FRAC}$(k). Upon receipt of an input data sample 114, X(k), index generator 140 may determine i(k) as a scaled version of the sample's magnitude (e.g., a scaled version of X(k)).

When received by read logic 156 of gain generator 142, the integer part, $i_{INT}$(k), of the lookup table index 160 is evaluated to determine two consecutive lookup table entries, a "floor" entry, LUT($n_{floor}$), and a "ceiling" entry, LUT($n_{ceil}$). In an embodiment, the two consecutive lookup table entries may be selected as LUT($n_{floor}$)=LUT($i_{INT}$(k)) and LUT($n_{ceil}$)=LUT($i_{INT}$(k)+1). Gain generator 142 performs a weighted interpolation process using the lookup table gains stored within the floor entry, LUT($n_{floor}$), and the ceiling entry, LUT($n_{ceil}$), in an embodiment, to produce the output gain 124, G(k). Weighted interpolation processes used in calculating the output gain 124, G(k), will be described in more detail later, in conjunction with FIG. 5.

It is desirable that the lookup table gains, LUT(n), within lookup table 150, include gains that may converge to accurately reflect the cumulative signal distortion produced by up-converter 104, power amplifier 106, and/or other non-linear devices that may add distortion to the signal. Because the cumulative signal distortion may not be known with accuracy at the beginning of some transmissions (e.g., at the beginning of a series of bursts), the lookup table gains may be initialized, in accordance with various embodiments. In addition, because the cumulative signal distortion may change over time, the lookup table gains are updated over time to continue to accurately reflect the cumulative signal distortion, in an embodiment. Accordingly, the lookup table gains are adaptive gains, and the system provides adaptive, digital pre-distortion.

As mentioned above, in an embodiment, gain generator 142 includes an update tracking table 152 (UTT). Update tracking table 152 is adapted to store update tracking information, and includes a plurality of entries, UTT(1 . . . N), where each entry corresponds to an entry within lookup table 150, in an embodiment. Accordingly, LUT(1) corresponds to UTT(1), and so on. Update tracking information stored within an entry of update tracking table 152 may indicate whether a corresponding entry within lookup table 150 has been previously updated, in an embodiment. For example, when an update tracking table entry, UTT(n), includes a value of zero, it may indicate that the corresponding lookup table entry, LUT(n), has not been previously updated, and when the update tracking table entry, UTT(n), includes a non-zero value, it may indicate that the corresponding lookup table entry, LUT(n), has been previously updated. Other values may be used to indicate whether or not a lookup table entry has or has not been updated, in other embodiments. In a further embodiment, a value stored within an update tracking table entry, UTT(n), may indicate how many times the corresponding lookup table entry, LUT(n), has been updated. As will be described in more detail later, this information may be used in determining a gain delta value (e.g., gain delta value 180, described later) for a lookup table gain. In another embodiment, the information within update tracking table 152 may be incorporated into lookup table 150 (e.g., each lookup table entry may include update tracking information). In still another embodiment, the information within update tracking table 152 may be excluded altogether from gain generator 142.

As mentioned briefly above, initialization and updating of lookup table 150 primarily is performed by table initialization/updating element 146, in an embodiment. Initialization of lookup table 150 may include setting one or more lookup table entries to an initial value, as will be described in more detail later. Updating of lookup table 150 includes the process of updating the values within the lookup table entries to more accurately reflect the actual cumulative signal distortion through portions of the system 100. As will be described in more detail later, updating is based on analysis of actual signals being processed by the system 100, rather than training sequences, as is used in some traditional systems. In addition, as will be described later, updating of lookup table 150 may be disabled or suspended, in an embodiment, while the system applies phase rotations to the system gain to compensate for insertion phase.

In an embodiment, an input data sample 114, X(k), and the lookup table index 160, i(k), are received by a second delay element 144, along with the output gain 124, G(k), produced by gain generator 142 for that input data sample 114. Second delay element 144 is adapted to delay these values for an amount of time (e.g., a number of clock cycles) that will result in synchronization of the input data sample 114 with production of the corresponding adjusted feedback sample 138 (e.g., an amount of time that allows the input data sample 114 to be pre-distorted, up-converted, amplified, fed back, down-converted, and gain-adjusted by the system). Accordingly, second delay element 144 enables table initialization/updating element 146 to link an input data sample 114, X(k), with its corresponding adjusted feedback sample 138, $X_{adj}(k)$, index 160, i(k), and output gain 124, G(k).

As discussed above, evaluation of the input/feedback phase difference indicator 151 may indicate that a relatively large, uncompensated-for insertion phase exists within the system. This insertion phase may result in input/feedback phase difference indicator 151 that is located outside of a target phase region. As also discussed above, when a relatively large, uncompensated-for insertion phase exists, the system (e.g., adjustment gain rotation element 149) may determine and apply a phase rotation to the adjustment gain. With the applied phase rotation, application of the adjustment gains (e.g., adjustment gains 137) to the feedback signal (e.g., to feedback samples 136) may result in an effective rotation of the input/feedback phase difference indicator 151 into the target phase region.

Figure 3:
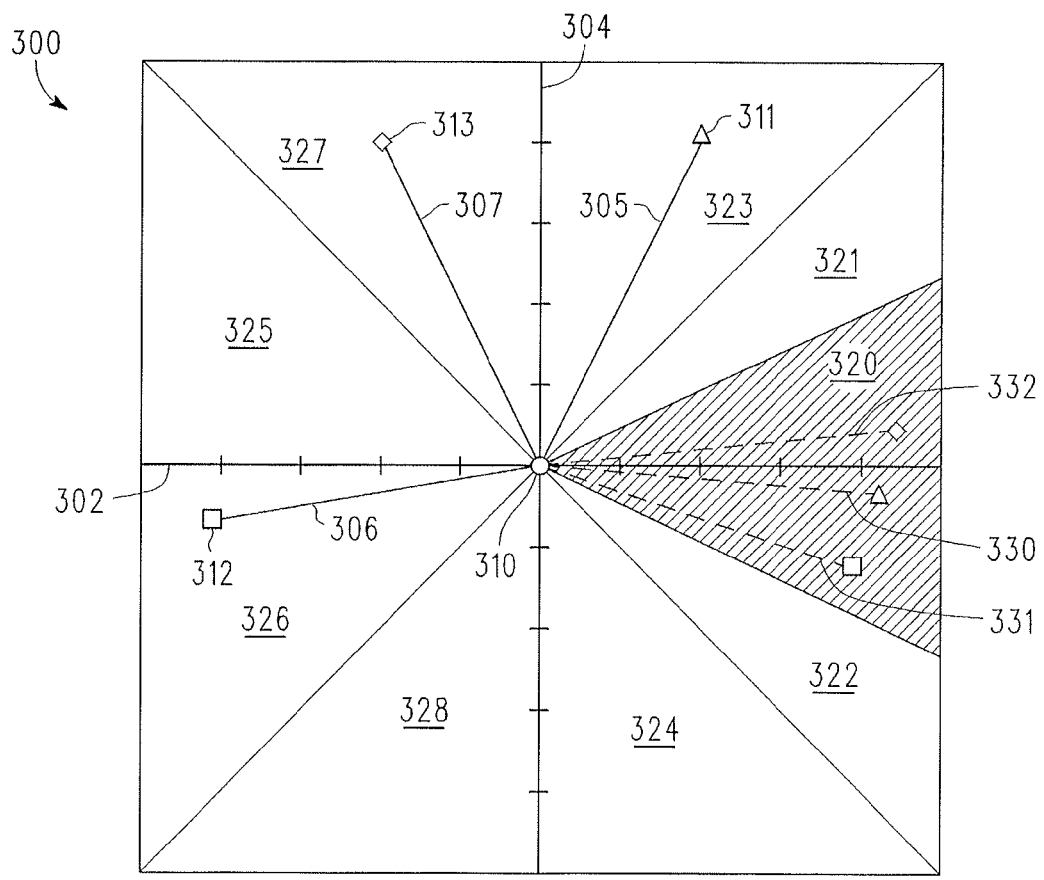
FIG. 3 is a graph illustrating effective rotation of several example error vectors, in accordance with an example embodiment.

FIG. 3 is a graph 300 illustrating effective rotation of several example vectors (e.g., vectors corresponding to input/feedback phase difference indicator 151), in accordance with an example embodiment. Graph 300 includes a real axis 302 and an imaginary axis 304. Vectors 305, 306, 307 are represented as solid lines, originating at the origin 310 of graph 300, and each terminating at a termination point 311, 312, 313, respectively. Each vector 305-307 may be represented in polar coordinates (e.g., as having a magnitude and a phase), and each termination point 311-313 may be represented in Cartesian coordinates (e.g., as having a real part and an imaginary part). As used herein, the term "vector" may include a complex value represented in polar coordinates (e.g., the magnitude and phase of a vector) or Cartesian coordinates (e.g., the real and imaginary values corresponding to the termination point).

In an embodiment, the 360° range of possible phase values may be divided into one or more phase sectors 321, 322, 323, 324, 325, 326, 327, 328, where the phase sectors 321-328 include non-overlapping, consecutive ranges of phase values. In the example embodiment of FIG. 3, eight phase sectors 321, 322, 323, 324, 325, 326, 327, and 328 are specified. In other embodiments, more or fewer phase sectors may be specified. The spans of some or all phase sectors may be the same or may be different, in various embodiments. For example, the spans of phase sectors 321-328 are about equal to each other at about 45°, in an embodiment, and accordingly each of the phase sectors 321-328 is represented by an octant of the 360° range of possible phase values.

As used herein, the term "target phase region" means a consecutive range of phase values into which a vector may be rotated, according to an embodiment. In a particular embodiment, a target phase region is defined in the system as a consecutive range of phases that includes a phase of 0°. For example, a target phase region may be defined, in an embodiment, as a consecutive range of phases within about +22.5° and about −22.5°, as indicated by shaded, target phase region 320. In another example embodiment, the target phase region may be defined, in an embodiment, as a consecutive range of phases within about +45° and about −45°. In other embodiments, a target phase region may have wider or narrower ranges, and/or may be non-symmetrically defined around 0° phase. In still other embodiments, a target phase region may not include a phase of 0°.

When a vector reflects a relatively small insertion phase (e.g., the input/feedback phase difference indicator 151 is located within target phase region 320), convergence may occur relatively quickly. As the insertion phase increases (e.g., the input/feedback phase difference indicator 151 is located outside of target phase region 320), convergence may occur more slowly or may not occur at all. Embodiments of the inventive subject matter are adapted to effectively rotate vectors located outside a target phase region into the target phase region in order to decrease the time it may take for the system to converge, and/or to increase a likelihood of convergence.

As FIG. 3 illustrates, vectors 305-307 each lie outside of target phase region 320, or within phase sectors 323, 326, and 327, respectively. In an embodiment, adjustment gains (e.g., adjustment gains 137, FIG. 1) are applied (e.g., by adjustment gain application element 148, FIG. 1) to effectively rotate the vectors 305-307 into the target phase region 320, thus producing rotated vectors 330, 331, 332, respectively. As will be described in more detail below, effective rotation of a vector (e.g., vector 305) may be achieved, in an embodiment, by computing in which phase sector (e.g., phase sector 323) the vector is located. When the vector is located in a phase sector (e.g., phase sector 323), the system may select and apply, to the feedback signal (e.g., a feedback sample 136, FIG. 1), an adjustment gain (e.g., adjustment gain 137, FIG. 1) that will result in the production of a rotated vector (e.g., rotated vector 330) located within the target phase region (e.g., target phase region 320). Accordingly, the system effectively rotates the vector into the target phase region. When the vector already is located within the target phase region, then alteration of the feedback signal may be bypassed.

Figure 4:
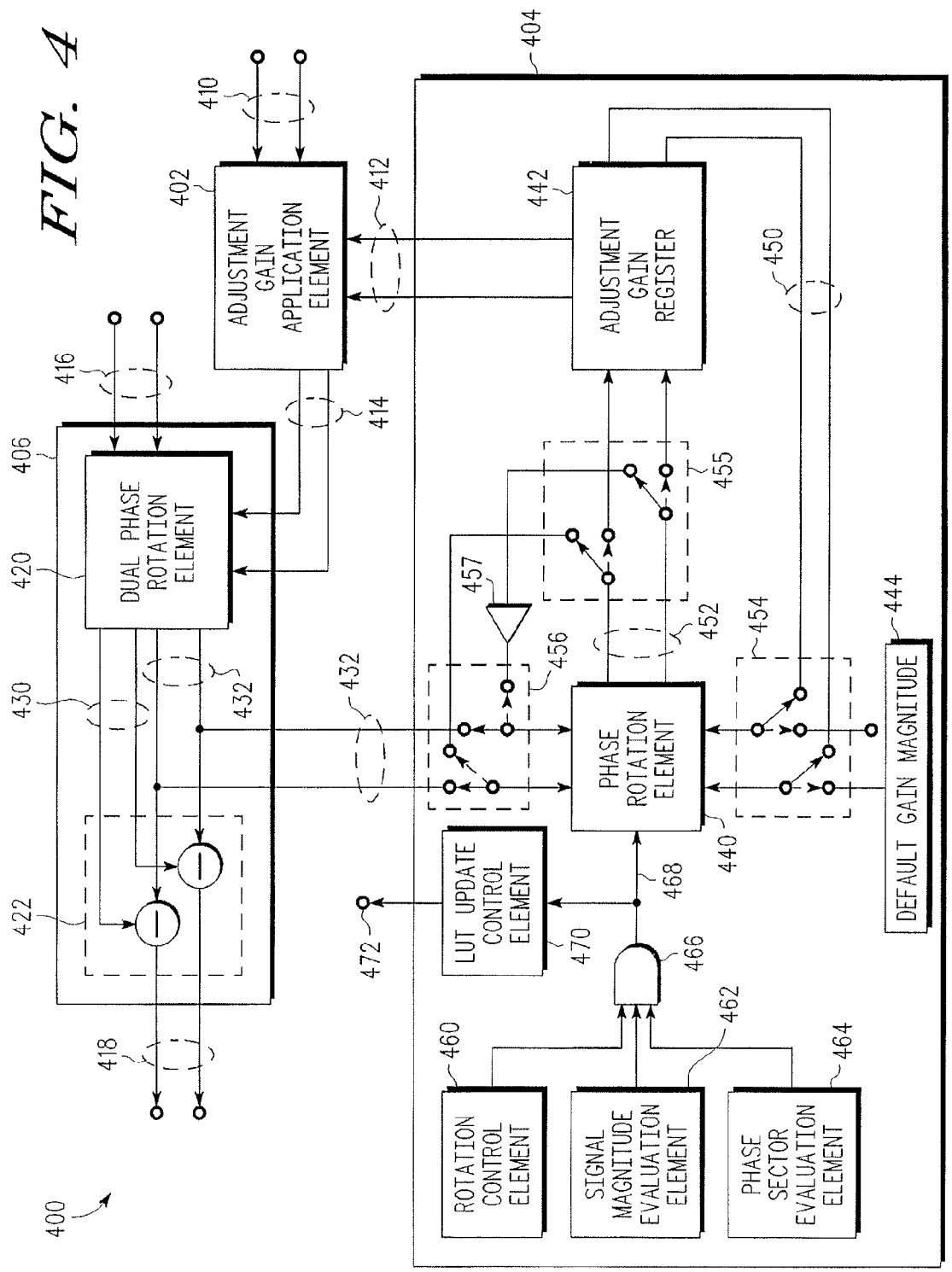
FIG. 4 illustrates a simplified block diagram of a portion of a DPD apparatus that performs phase rotation of a system gain, and applies the rotated system gain to a feedback signal, in accordance with an example embodiment.
Figure 5:
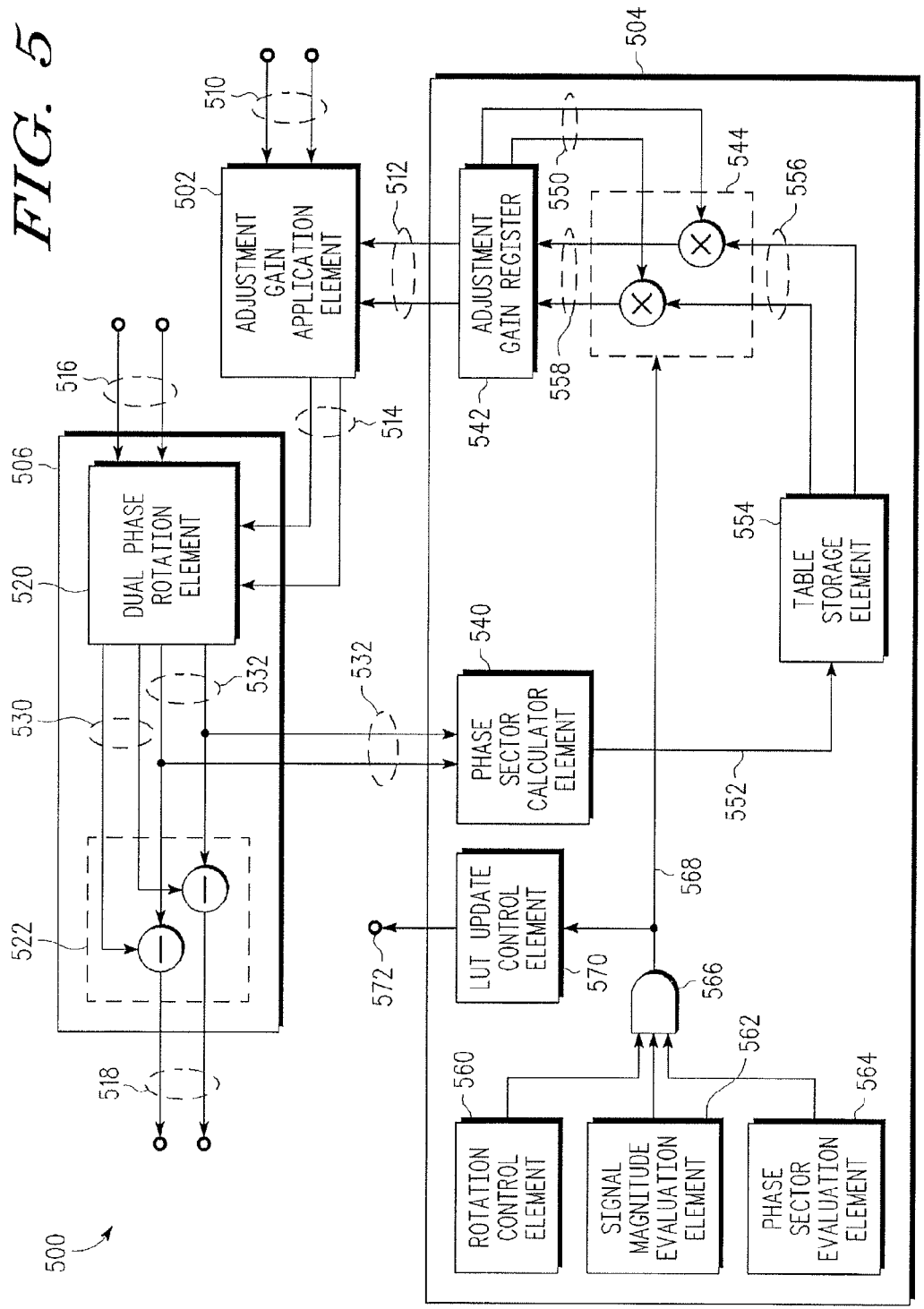
FIG. 5 illustrates a simplified block diagram of a portion of a DPD apparatus that performs phase rotation of a system gain, and applies the rotated system gain to a feedback signal, in accordance with an example embodiment.

FIGS. 4 and 5 illustrate embodiments of portions of DPD apparatus that perform phase rotation of an adjustment gain, and apply the rotated adjustment gain to a feedback signal. In the embodiment illustrated in FIG. 4, an adjustment gain rotation element 404 receives an input/feedback phase difference indicator (e.g., a rotated, adjusted feedback sample 432, $X_{rot-adj}(k)$), and rotates the adjustment gain by an amount approximately equal to the phase reflected in the input/feedback phase difference indicator. In an alternate embodiment illustrated in FIG. 5, an adjustment gain rotation element 504 receives an input/feedback phase difference indicator (e.g., a rotated, adjusted feedback sample 532, $X_{rot-adj}(k)$), determines which phase sector the input/feedback phase difference indicator is located within, and selects a rotation vector from a table of rotation vectors based on the determined phase sector. Each of these embodiments will now be described in detail.

FIG. 4 illustrates a simplified block diagram of a portion of a DPD apparatus that performs phase rotation of an adjustment gain, and applies the rotated adjustment gain to a feedback signal, in accordance with an example embodiment. Apparatus 400 includes an adjustment gain application element 402 (e.g., system gain application element 148, FIG. 1), an adjustment gain rotation element 404, and a signal difference calculator 406, in an embodiment. Signal difference calculator 406 may form a portion of a table initialization/updating element (e.g., table initialization/updating element 146, FIG. 1), in an embodiment. In alternate embodiments, all or portions of signal difference calculator 406 may be distinct from the table initialization/updating element.

Adjustment gain application element 402 is adapted to receive a feedback signal in the form of at least one feedback sample 410 (e.g., feedback sample 136, FIG. 1). Adjustment gain application element 402 also is adapted to receive at least one adjustment gain 412 (e.g., adjustment gain 137, FIG. 1) from adjustment gain rotation element 404, and to apply each adjustment gain 412 to a feedback sample 410 to produce an adjusted feedback sample 414 (e.g., adjusted feedback sample 138, FIG. 1). In an embodiment, feedback samples 410, adjustment gains 412, and adjusted feedback samples 414 may be complex values represented in Cartesian coordinates. In alternate embodiments, some or all of feedback samples 410, adjustment gains 412 or adjusted feedback samples 414 may be represented in polar coordinates or using some other representation.

Signal difference calculator 406 is adapted to receive at least one adjusted feedback sample 414 and at least one input data sample 416 (e.g., input data sample 114, FIG. 1). Signal difference calculator 406 also is adapted to produce an output vector 418 (e.g., an error vector, $E(k)$), which reflects a difference between each adjusted feedback sample 414 and input data sample 416. This output vector 418 may be used, in an embodiment, to perform LUT updates, as discussed previously. In an embodiment, input data samples 416 and output vectors 418 may be complex values represented in Cartesian coordinates. In alternate embodiments, either or both of input data samples 416 or output vectors 418 may be represented in polar coordinates or using some other representation.

Signal difference calculator 406 also is adapted to receive and rotate an input data sample 416 and an adjusted feedback sample 414 to produce a rotated input data sample 430 and a rotated, adjusted feedback sample 432, respectively, and to produce an output vector 418 that represents a difference between the rotated input data sample 430 and the rotated, adjusted feedback sample 432. In an embodiment, rotated input data samples 430 and rotated, adjusted feedback samples 432 may be complex values represented in Cartesian coordinates. In alternate embodiments, either or both of rotated input data samples 430 or rotated, adjusted feedback samples 432 may be represented in polar coordinates or using some other representation.

In an embodiment, signal difference calculator 406 includes a dual phase rotation element 420 and a difference calculator 422. Dual phase rotation element 420 may be, for example, a dual CORDIC device and/or another device adapted to phase rotate the input data sample 416 and the adjusted feedback sample 414 in a parallel manner by substantially equal angles of rotation. In an embodiment, the rotation angle applied to both the input data sample 416 and the adjusted feedback sample 414 approximately equals the negative of the phase component of the input data sample 416. Accordingly, dual phase rotation element 420 is adapted to rotate the input data sample 416 and the adjusted feedback sample 414 by a rotation angle that substantially removes the phase component of the input data sample 430.

Difference calculator 422 is adapted to receive the rotated input data sample 430 and the rotated, adjusted feedback sample 432, and to produce an output vector 418 that reflects a difference between them. In an embodiment, difference calculator 422 includes a first difference element 434, which produces a difference between the real parts of the rotated input data sample 430 and the rotated, adjusted feedback sample 432, and a second difference element 436, which produces a difference between the imaginary parts of the rotated input data sample 430 and the rotated, adjusted feedback sample 432.

Adjustment gain rotation element 404 is adapted to produce an adjustment gain 412, which is applied by adjustment gain application element 402 to a feedback sample 410. In addition, adjustment gain rotation element 404 is adapted to receive an input/feedback phase difference indicator (e.g., input/feedback phase difference indicator 151 (FIG. 1) or a rotated, adjusted feedback sample 432, $X_{rot-adj}(k)$), and to rotate the adjustment gain by a gain rotation angle represented by the input/feedback phase difference indicator.

In an embodiment, adjustment gain rotation element 404 includes a phase rotation element 440 and an adjustment gain register 442. Adjustment gain rotation element 404 also may include a plurality of hardware or firmware elements (e.g., switches 454, 455, 456), in an embodiment, which enable adjustment gain rotation element 404 to operate in a first mode or to operate in a second mode. For example, these elements may include switches 454, 455, 456, which enable adjustment gain rotation element 404 to operate in the first mode when switched to first positions, as shown in FIG. 4. When switches 454-456 are switched to second positions, illustrated as dashed switch connections, adjustment gain rotation element 404 may operate in the second mode. Both modes of operation are used sequentially to provide insertion phase correction. Operation in the first mode will first be described, below.

In the first mode, phase rotation element 440 is adapted to receive the input/feedback phase difference indicator. In an embodiment, the input/feedback phase difference indicator is received in the form of the rotated, adjusted feedback sample 432. In an embodiment, phase rotation element 440 is also adapted to produce a gain rotation angle, based on the input/feedback phase difference indicator (e.g., the rotated, adjusted feedback sample 432). For example, this may include performing a Cartesian-to-polar transformation of the rotated, adjusted feedback sample 432, where the gain rotation angle may approximately equal a negative of the phase part of the polar representation of the rotated, adjusted feedback sample 432.

Phase rotation element 440 is also adapted to receive the adjustment gain 450 from adjustment gain register 442. In addition, phase rotation element 440 is adapted to rotate the adjustment gain 450 by the gain rotation angle to produce a rotated adjustment gain 452. This rotation process may include one or more polar-to-Cartesian and/or Cartesian-to-polar transformations, in various embodiments. In an embodiment, adjustment gains 450 and rotated adjustment gains 452 may be complex values represented in Cartesian coordinates. In alternate embodiments, either or both of adjustment gains 450 or rotated adjustment gains 452 may be represented in polar coordinates or using some other representation. In an embodiment, phase rotation element 440 may be, for example, a CORDIC device and/or another device adapted to perform Cartesian-to-polar and/or polar-to-Cartesian transformations and to rotate the adjustment gain 450 by the gain rotation angle. In an embodiment, the rotated adjustment gains 452 may be directly inserted back into the adjustment gain register 442 when switches 456 are in second positions (e.g., the dashed switch positions). This may achieve insertion phase correction when the magnitude of the real and imaginary parts are corrected for the gain of the phase rotation element 440. In a preferred embodiment, during the first mode of operations, the rotated adjustment gain 452 may be retained in adjustment gain register 442.

As mentioned above, switches 454-456 may be switched to second positions, shown as dashed switch positions in FIG. 4, in order for adjustment gain rotation element 404 to operate in the second mode. Operation in the second mode may enable adjustment gain rotation element 404 to compensate for a cumulative magnitude error that may otherwise be reflected in the value stored in the adjustment gain register 442 if the first mode was used solely and repetitively. The cumulative magnitude error may represent a sum of relatively small magnitude errors that accumulate over a plurality of updates (e.g., over hundreds or thousands of updates). In an embodiment, switches 454-456 are periodically switched to the second positions (e.g., the dashed switch positions) to provide operation in the second mode immediately after the operations of the first mode are completes.

When operating in the second mode, the rotated adjustment gain 452, which is output from phase rotation element 440, is re-routed. In an embodiment, switches 455 left in the first switch positions (e.g., as shown in FIG. 4) to provide the rotated adjustment gain 452 to inverter 457. Inverter 457 may be adapted to produce a complex conjugate of the rotated adjustment gain 452. In an embodiment, the complex conjugate operation includes passing the magnitude component of the rotated phase adjustment gain 452, and inverting the phase component of the rotated phase adjustment gain 452. Switches 456 may be adapted to provide the complex conjugate as a first input to phase rotation element 440 via switches 456, rather than providing the phase difference indicator (e.g., the rotated, adjusted feedback sample 432).

In an embodiment, default gain magnitude register 444 includes a fixed real magnitude having a value selected to substantially provide a magnitude to adjust for the gain of the phase rotation element 440, and independent of insertion phase. For example, a fixed magnitude value may equal about 0.607252935 multiplied by the gain, although other fixed magnitude values may be selected, in other embodiments. Switches 454 may be adapted to provide a default gain, consisting of the default gain magnitude 444 and zero phase, as a second input to phase rotation element 440, rather than providing the adjustment gain 450.

In the second mode, phase rotation element 440 is adapted to produce a gain rotation angle based on the complex conjugate of the rotated phase adjustment gain 452. Phase rotation element 440 is also adapted to rotate the real gain magnitude 444 by applying the gain rotation angle to the default gain, in order to produce the rotated adjustment gain 452. Switches 455 are switched to the second position, to provide the rotated adjustment gain 452 to adjustment gain register 442. In alternate embodiments, hardware or firmware elements other than switches 454-456 may be used to switch operations of adjustment gain rotation element 404 between the first mode and the second mode.

When rotated according to embodiments of the inventive subject matter and applied to a feedback sample 410, the adjustment gain 412 may result in more rapid convergence. However, under certain circumstances, rotation of the adjustment gain may be undesirable, and thus rotation of the adjustment gain may be bypassed. For example, rotation of the adjustment gain may be bypassed, in an embodiment, when the magnitude of the phase offset reflected in the input/feedback phase difference indicator is smaller than some threshold (e.g., a vector corresponding to the rotated, adjusted feedback sample 432 already is located within the target phase region). Rotation of the adjustment gain also or alternatively may be bypassed, in an embodiment when the magnitude of the input signal (e.g., input signal 114, FIG. 1) is below a threshold. Additionally, rotation of the adjustment gain may be bypassed, in an embodiment, during certain portions of a transmission.

Accordingly, apparatus 400 may further include one or more elements adapted to enable and/or disable rotation of the adjustment gain. These elements may include, for example, rotation control element 460, signal magnitude evaluation element 462, and phase sector evaluation element 464. In an embodiment, control signals from the one or more elements 460, 462, 464 may be evaluated to determine whether adjustment gain will be rotated. For example, in an embodiment, a logic element 466 (e.g., an AND gate) may receive control signals from elements 460, 462, 464, and when all elements 460, 462, 464 have positive control signals, logic element 466 may produce an enable/disable signal 468 that enables phase rotation element 440 to apply a phase rotation to the adjustment gain. Alternatively, when any one or more of elements 460, 462, 464 have a negative control signal, logic element 466 may produce an enable/disable signal 468 that disables phase rotation element 440, thus bypassing the process of applying the phase rotation to the adjustment gain.

Rotation control element 460 may be adapted to produce a control signal based on the presence or absence of an external signal, such as a trigger signal, which is provided by another source within the system. For example, an external signal may be provided for a period of time at the beginning of each input signal burst, in an embodiment. In alternate embodiments, an external signal may be provided for a period of time at the beginning of each n signal bursts, where n may be any integer number. In still other embodiments, external signals may be provided for a period of time based on some other event. When an external signal is received, then rotation control element 460 may produce a positive control signal. Otherwise, rotation control element 460 may produce a negative control signal, thus disabling inverse signal gain rotations.

Signal magnitude evaluation element 462 may be adapted to determine and indicate whether an input signal (e.g., an input data sample 114, FIG. 1) is greater than or less than a signal magnitude threshold. For example, signal magnitude evaluation element 462 may include circuitry to evaluate one or more bits of the input signal. In an embodiment, a condition of exceeding a signal magnitude threshold may simply be determined based on the values of one or more of the most significant bits (e.g., the three most significant bits, although other numbers could be used) of a real part of the input signal. In an embodiment, a signal magnitude threshold is approximately 10% of a maximum possible signal magnitude (e.g., a signal magnitude when all magnitude bits are 1). In other embodiments, the signal magnitude threshold may be higher or lower than 10% of the maximum possible signal magnitude. When any one or more of the most significant bits are high, then signal magnitude evaluation element 462 may produce a positive control signal as an indication that the input signal is greater than the signal magnitude threshold. Otherwise, when the most significant bits are low, signal magnitude evaluation element 462 may produce a negative control signal, thus disabling adjustment gain rotations.

Phase sector evaluation element 464 may be adapted to determine and indicate whether a vector corresponding to an input/feedback phase difference indicator (e.g., input/feedback phase difference indicator 151 (FIG. 1) or rotated, adjusted feedback sample 432) is located within a target phase region. In an embodiment, phase sector evaluation element 464 may include circuitry to evaluate the signs of the real and imaginary parts of the input/feedback phase difference indicator (e.g., the rotated, adjusted feedback sample), and further to compare the magnitudes of the real and imaginary parts to determine whether a vector corresponding to the input/feedback phase difference indicator is located within a target phase region. For example, referring also to FIG. 3, phase sector evaluation element 464 may determine that a vector corresponding to the input/feedback phase difference indicator falls within target phase region 320 when the $P_r(k) > 0$, and when $|P_r(k)/2| > |P_i(k)|$, where $P_r(k)$ is the real part of the input/feedback phase difference indicator, and $P_i(k)$ is the imaginary part of the input/feedback phase difference indicator. When the input/feedback phase difference indicator is a rotated, adjusted feedback sample 432, phase sector evaluation element 464 may determine that a vector corresponding to the rotated, adjusted feedback sample 432 falls within target phase region 320 when $X_{rot-adj-r}(k) > 0$, and when $|X_{rot-adj-r}(k)/2| > |X_{rot-adj-i}(k)|$, where $X_{rot-adj-r}(k)$ is the real part the rotated, adjusted feedback sample 432, and $X_{rot-adj-i}(k)$ is the imaginary part of the rotated, adjusted feedback sample 432. When phase sector evaluation element 464 determines that a vector corresponding to the input/feedback phase difference indicator is not located within a target phase region, then phase sector evaluation element 464 may produce a positive control signal. Otherwise, when phase sector evaluation element 464 determines that a vector corresponding to the input/feedback phase difference indicator is located within a target phase region, then phase sector evaluation element 464 may produce a negative control signal, thus disabling inverse signal gain rotations.

In an embodiment, while adjustment gains are being rotated and applied to adjust the feedback signal, updates of the lookup table (e.g., LUT 150, FIG. 1) may be suspended. Suspension of lookup table updates may be performed so that the lookup table entries are not affected by the rotated adjustment gains. In an embodiment, adjustment gain rotation element apparatus 400 further includes an LUT update control element 470. In an embodiment, LUT update control element 470 may be connected to the output of logic element 466, and when the enable/disable signal 468 indicates that phase rotation element 440 is enabled (e.g., adjustment gain rotation is being performed), LUT update control element 470 may produce a control signal output 472 to disable LUT updates. Otherwise, when the enable/disable signal 468 indicates that phase rotation element 440 is disabled (e.g., adjustment gain rotation is not being performed), LUT update control element 470 may not produce a control signal output 472 to disable LUT updates.

The embodiment of the adjustment gain rotation element illustrated in FIG. 4 may be advantageous in that it may produce very precise adjustment gains, because the actual phase of the input/feedback phase difference indicator (e.g., input/feedback phase difference indicator 151, FIG. 1 or rotated, adjusted feedback sample 432) is used to rotate the adjustment gain. However, the embodiment illustrated in FIG. 4 may perform one or more Cartesian-to-polar and/or polar-to-Cartesian coordinate system transforms during the process of calculating the adjustment gain, and thus the embodiment of FIG. 4 includes circuitry (e.g., phase rotation element 440) capable of performing the transformations. In contrast to the embodiment of FIG. 4, the embodiment illustrated in FIG. 5 determines a phase sector within which a vector corresponding to the input/feedback phase difference indicator is located, rather than determining the actual phase, and the phase sector determination is used to select a rotation vector from a table. The selected rotation vector is used to rotate the adjustment gain, in an embodiment. Although the embodiment illustrated in FIG. 5 may result in a coarser phase rotation than the embodiment illustrated in FIG. 5, the embodiment illustrated in FIG. 5 may be advantageous in that it may be implemented using relatively simple and inexpensive circuitry.

FIG. 5 illustrates a simplified block diagram of a portion of a DPD apparatus that performs phase rotation of an adjustment gain, and applies the rotated adjustment gain to a feedback signal, in accordance with another example embodiment. Apparatus 500 includes an adjustment gain application element 502 (e.g., system gain application element 148, FIG. 1), an adjustment gain rotation element 504, and a signal difference calculator 506, in an embodiment. Signal difference calculator 506 may form a portion of a table initialization/updating element (e.g., table initialization/updating element 146, FIG. 1), in an embodiment. In alternate embodiments, all or portions of signal difference calculator 506 may be distinct from the table initialization/updating element.

Adjustment gain application element 502 is adapted to receive a feedback signal in the form of at least one feedback sample 510 (e.g., feedback sample 136, FIG. 1). Adjustment gain application element 502 also is adapted to receive at least one adjustment gain 512 (e.g., adjustment gain 137, FIG. 1) from adjustment gain rotation element 504, and to apply each adjustment gain 512 to a feedback sample 510 to produce an adjusted feedback sample 514 (e.g., adjusted feedback sample 138, FIG. 1). In an embodiment, feedback samples 510, adjustment gains 512, and adjusted feedback samples 514 may be complex values represented in Cartesian coordinates. In alternate embodiments, some or all of feedback samples 510, adjustment gains 512 or adjusted feedback samples 514 may be represented in polar coordinates or using some other representation.

Signal difference calculator 506 is adapted to receive at least one adjusted feedback sample 514 and at least one input data sample 516 (e.g., input data sample 114, FIG. 1). Signal difference calculator 506 also is adapted to produce an output vector 518 (e.g., an error vector, E(k)), which reflects a difference between each adjusted feedback sample 514 and input data sample 516. This output vector 518 may be used, in an embodiment, to perform LUT updates, as discussed previously. In an embodiment, input data samples 516 and output vectors 518 may be complex values represented in Cartesian coordinates. In alternate embodiments, either or both of input data samples 516 or output vectors 518 may be represented in polar coordinates or using some other representation.

Signal difference calculator 506 also is adapted to receive and rotate an input data sample 516 and an adjusted feedback sample 514 to produce a rotated input data sample 530 and a rotated, adjusted feedback sample 532, respectively, and to produce an output vector 518 that represents a difference between the rotated input data sample 530 and the rotated, adjusted feedback sample 532. In an embodiment, rotated input data samples 530 and rotated, adjusted feedback samples 532 may be complex values represented in Cartesian coordinates. In alternate embodiments, either or both of rotated input data samples 530 or rotated, adjusted feedback samples 532 may be represented in polar coordinates or using some other representation.

In an embodiment, signal difference calculator 506 includes a dual phase rotation element 520 and a difference calculator 522. Dual phase rotation element 520 may be, for example, a dual CORDIC device and/or another device adapted to phase rotate the input data sample 516 and the adjusted feedback sample 514 in a parallel manner by substantially equal angles of rotation. In an embodiment, the rotation angle applied to both the input data sample 516 and the adjusted feedback sample 514 approximately equals the negative of the phase component of the input data sample 516. Accordingly, dual phase rotation element 520 is adapted to rotate the input data sample 516 and the adjusted feedback sample 514 by a rotation angle that substantially removes the phase component of the input data sample 530.

Difference calculator 522 is adapted to receive the rotated input data sample 530 and the rotated, adjusted feedback sample 532, and to produce an output vector 518 that reflects a difference between them. In an embodiment, difference calculator 522 includes a first difference element 534, which produces a difference between the real parts of the rotated input data sample 530 and the rotated, adjusted feedback sample 532, and a second difference element 536, which produces a difference between the imaginary parts of the rotated input data sample 530 and the rotated, adjusted feedback sample 532.

Adjustment gain rotation element 504 is adapted to produce an adjustment gain 512, which is applied by adjustment gain application element 502 to a feedback sample 510. In addition, adjustment gain rotation element 504 is adapted to receive an input/feedback phase difference indicator (e.g., input/feedback phase difference indicator 151 (FIG. 1) or a rotated, adjusted feedback sample 532, $X_{rot\text{-}adj}(k)$), and to rotate the adjustment gain by a gain rotation angle that is determined based on the input/feedback phase difference indicator.

In an embodiment, adjustment gain rotation element 504 includes a phase sector calculator element 540, an adjustment gain register 542, a table storage element 554, and a combiner 544. Phase sector calculator element 540 is adapted to receive the input/feedback phase difference indicator. In an embodiment, the input/feedback phase difference indicator is received in the form of the rotated, adjusted feedback sample 532.

As will be described in more detail below, table storage element 554 is adapted to store a rotation vector table (e.g., Table 2, below), which includes complex multiplication vectors associated with the phase sectors (e.g., phase sectors 321-328, FIG. 3) defined within the system. Using the example of FIG. 3, eight phase sectors 321-328 are defined, in an embodiment, where each phase sector has a span of about 45° (e.g., each phase sector is an octant). In other embodiments, more or fewer than eight phase sectors may be defined within the system, and at least some of the phase sectors may have different spans.

Phase sector calculator element 540 is adapted to receive an input/feedback phase difference indicator (e.g., the rotated, adjusted feedback sample 532, $X_{rot\text{-}adj}(k)$) and to determine which phase sector (e.g., which one of sectors 321-328, FIG. 3) a vector corresponding to the input/feedback phase difference indicator is located. In an embodiment, phase sector calculator element is further adapted to produce a value 552 that identifies an entry of the rotation vector table, stored within table storage element 554, which corresponds to the determined phase sector. For purposes of explanation and not of limitation, the value 552 is referred to as an index.

In an embodiment, phase sector calculator element 540 performs at least three evaluations of the real and imaginary parts of a rotated, adjusted feedback sample 532 to produce binary values which, when combined, produce the value 552 that identifies an entry of the rotation vector table. In an embodiment, the value 552 includes an index into the rotation vector table. These evaluations may include evaluating the sign of the real part of the rotated, adjusted feedback sample 532 (e.g., the most significant bits), evaluating the sign of the imaginary part of the rotated, adjusted feedback sample 532, and comparing the magnitudes of the real and imaginary parts of the rotated, adjusted feedback sample 532. Table 1 illustrates binary values produced using three evaluations of the rotated, adjusted feedback sample 532. The three evaluations, which may be implemented using relatively simple logic circuits, are whether: $X_{rot\text{-}adj\text{-}r}(k)<0$; $|X_{rot\text{-}adj\text{-}r}(k)|<|X_{rot\text{-}adj\text{-}i}(k)|$; and $X_{rot\text{-}adj\text{-}i}(k)<0$. For vectors located within each of eight phase sectors defined in a system, in accordance with an embodiment, the three evaluations may yield the following binary values and indices:

TABLE 1

Phase Sector Indices

| Index | $X_{rot\text{-}adj\text{-}r}(k) < 0$ | $\|X_{rot\text{-}adj\text{-}r}(k)\| < \|X_{rot\text{-}adj\text{-}i}(k)\|$ | $X_{rot\text{-}adj\text{-}i}(k) < 0$ |
|---|---|---|---|
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

The decimal value for each entry, represented by the index for each entry, may be used as an index into the rotation vector table, as previously described.

Each entry of the rotation vector table may correspond to a phase sector, in an embodiment. In addition, each entry may include a complex gain rotation vector (e.g., a vector having a real part and an imaginary part) which, when combined with an adjustment gain (e.g., adjustment gain 550), functions to rotate the adjustment gain by a gain rotation angle, thus producing a rotated adjustment gain (e.g., rotated adjustment gain 558), which may be applied to a feedback sample 510. Table 2 is an example of a rotation vector table, which includes eight entries, each of which corresponds to a phase sector defined in a system, according to an embodiment:

TABLE 2

Rotation Vector Table

| Sector Index | Gain Rotation Angle | Real | Imaginary |
|---|---|---|---|
| 0 | 22.5 | 0.923880 | −0.382683 |
| 1 | −22.5 | 0.923880 | 0.382683 |
| 2 | 67.5 | 0.382683 | −0.923880 |
| 3 | −67.5 | 0.382683 | 0.923880 |
| 4 | 157.5 | −0.923880 | −0.382683 |
| 5 | −157.5 | −0.923880 | 0.382683 |
| 6 | 112.5 | −0.382683 | −0.923880 |
| 7 | −112.5 | −0.382683 | 0.923880 |

The sector index indicates which sector each entry corresponds to, and the gain rotation angle indicates the approximate gain rotation angle that will be applied to the adjustment gain. The real and imaginary values for each entry represent a gain rotation vector. For example, referring also to FIG. 3, sector index 0 may correspond to phase sector 321, sector index 1 may correspond to phase sector 322, sector index 2 may correspond to phase sector 323, and so on. As Table 2 indicates, when a vector associated with a rotated, adjusted feedback sample 532 is located within a phase sector indexed by index 0 or 1 (e.g., phase sector 321 or 322, FIG. 3), application of the corresponding gain rotation vectors to the adjustment gain will result in effective rotation of the adjustment gain by gain rotation angles of +22.5° or −22.5°, respectively.

As FIG. 3 illustrates, an embodiment may have the target phase region 320 defined within phase sectors 321 and 322. Because the target phase region 320 is located within these phase sectors 321, 322, a different gain rotation vector may be applied. Table 3 is an example of a rotation vector table, in which the gain rotation vectors corresponding to two phase sectors (e.g., phase sectors 321 and 322) produce different rotations than the corresponding gain rotation vectors of Table 2:

TABLE 3

Alternative Rotation Vector Table

| Sector Index | Gain Rotation Angle | Real | Imaginary |
|---|---|---|---|
| 0 | 35.8 | 0.811242 | −0.584710 |
| 1 | −35.8 | 0.811242 | 0.584710 |
| 2 | 67.5 | 0.382683 | −0.923880 |
| 3 | −67.5 | 0.382683 | 0.923880 |
| 4 | 157.5 | −0.923880 | −0.382683 |
| 5 | −157.5 | −0.923880 | 0.382683 |
| 6 | 112.5 | −0.382683 | −0.923880 |
| 7 | −112.5 | −0.382683 | 0.923880 |

In various alternate embodiments, the gain rotation angles may be different from those indicated in Table 2 and Table 3, and thus a rotation vector table may include correspondingly different values for the real and/or imaginary parts of the gain rotation vectors.

Based on the value 552 provided by phase sector calculator element 540, a gain rotation vector 556 is produced from the rotation vector table stored within table storage element 554, in an embodiment. In an embodiment, combiner 544 combines (e.g., multiplies) the gain rotation vector 556 with the adjustment gain 550, to produce a rotated adjustment gain 558, which may be retained in adjustment gain register 542.

When rotated according to embodiments of the inventive subject matter and applied to a feedback sample 510, the adjustment gain 512 may result in more rapid convergence. However, under certain circumstances, rotation of the adjustment gain may be undesirable, and thus rotation of the adjustment gain may be bypassed, as discussed previously.

Accordingly, apparatus 500 may further include one or more elements adapted to enable and/or disable rotation of the adjustment gain. These elements may include, for example, rotation control element 560, signal magnitude evaluation element 562, and phase sector evaluation element 564. In an embodiment, control signals from the one or more elements 560, 562, 564 may be evaluated to determine whether adjustment gain will be rotated. For example, in an embodiment, a logic element 566 (e.g., an AND gate) may receive control signals from elements 560, 562, 564, and when all elements 560, 562, 564 have positive control signals, logic element 566 may produce an enable/disable signal 568 that enables combiner 544 to apply a phase rotation to the adjustment gain. Alternatively, when any one or more of elements 560, 562, 564 have a negative control signal, logic element 566 may produce an enable/disable signal 568 that disables combiner 544, thus bypassing the process of applying the phase rotation to the adjustment gain. Elements 560, 562, 564, and 566 may be substantially similar to elements 460, 462, 464, and 466 of FIG. 4, and therefore they are not discussed again in detail here. In addition, while phase rotations are being applied to the adjustment gain, updates of the lookup table (e.g., LUT 150, FIG. 1) may be suspended. In an embodiment, adjustment gain rotation element apparatus 504 further includes an LUT update control element 570, similar in function to the corresponding element discussed in conjunction with FIG. 4, which produces a control signal output 572 that may disable LUT updates while adjustment gains are being applied to adjust the feedback signal.

Figure 6:
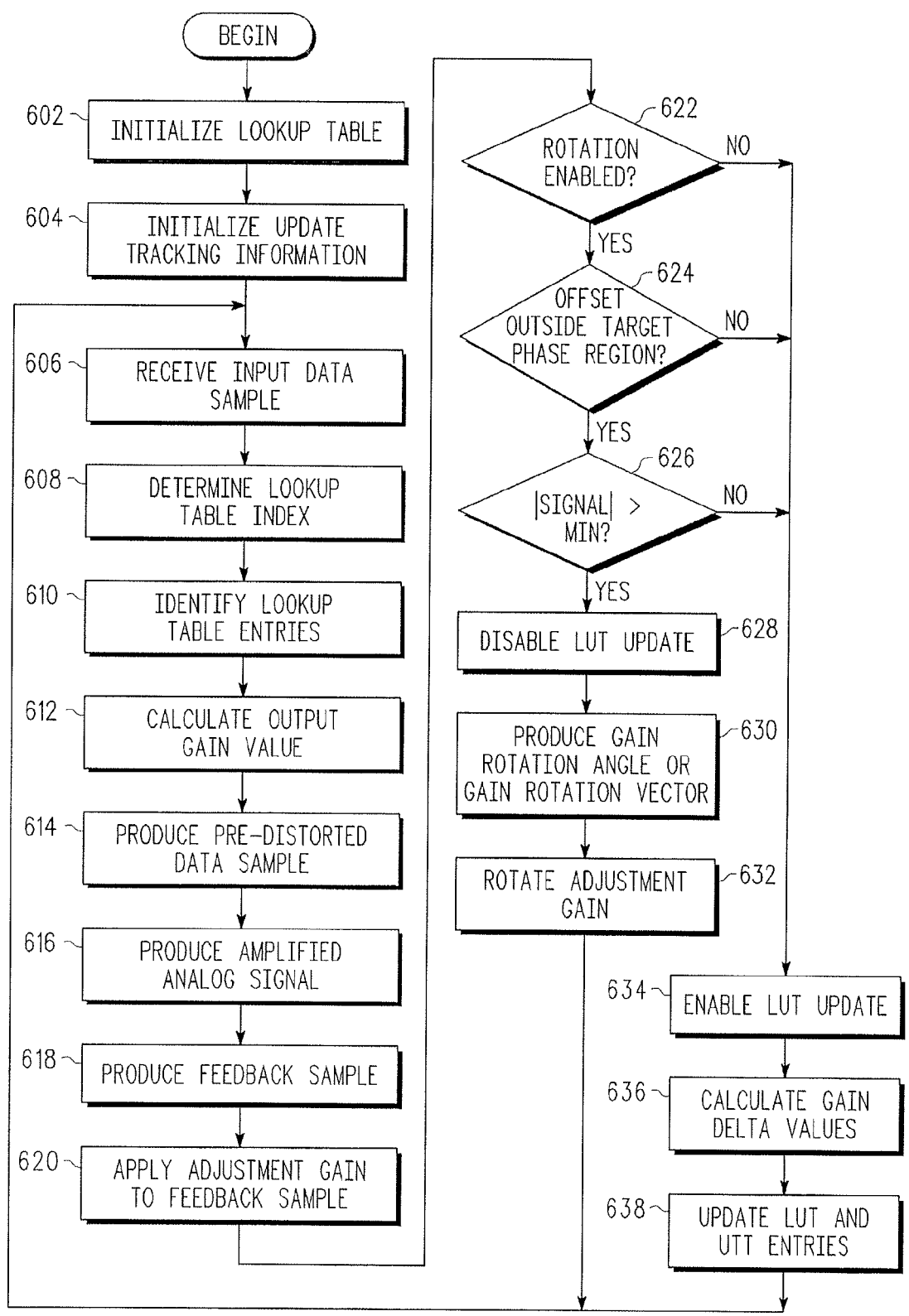
FIG. 6 illustrates a flowchart of a method for performing adaptive pre-distortion with feedback signal phase rotation, in accordance with an example embodiment.

FIG. 6 illustrates a flowchart of a method for performing adaptive pre-distortion, in accordance with an example embodiment. The method begins, in block 602, by initializing the lookup table (e.g., LUT 150, FIG. 1). In an embodiment, this includes writing an initial lookup table gain into at least some of the multiple lookup table entries, LUT(n). In an embodiment, the initial lookup table gain is a pre-defined gain, $G_{INITIAL}$. In an embodiment, $G_{INITIAL}$ may be a complex value represented by [$G_{INITIALr}$, $G_{INITIALi}$]. In an embodiment, each $G_{INITIAL}$=[1,0], or $G_{INITIALr}$=1 and $G_{INITIALi}$=0. In other embodiments, other initial values may be selected, and/or fewer than all lookup table entries may be set to initial values. In still another embodiment, none of the lookup table entries may be set to initial values, and any arbitrary values that may exist within the lookup table may simply be overwritten the first time the values are updated.

As mentioned previously in conjunction with the description of FIG. 1, a previous gain, G(previous), may be used in calculating an output gain value, G(k) (e.g., output gain value 124, FIG. 1), in an embodiment. In order to produce an initial value for the calculation, an initial previous gain value may be stored into a previous gain register (e.g., previous gain register 158, FIG. 1) and/or memory location. In an embodiment, the previous gain, G(previous), may be initialized to the same pre-defined, initial gain, $G_{INITIAL}$, or to a different pre-defined, initial gain. In an embodiment, the previous gain is set to an initial value of [1, 0]. In other embodiments, other initial values may be selected. In still other embodiments, previous gain values may not be used at all in calculating the output gain value, G(k).

In an embodiment, the system maintains update tracking information, which indicates whether or not each of the lookup table entries has been updated. The update tracking information is maintained in an update tracking table (e.g., UTT 152, FIG. 1), in an embodiment. In another embodiment, the update tracking information may be maintained in an update tracking field of each lookup table entry. In an embodiment, the update tracking information is initialized, in block 604. This may include, for example, writing initial values into the update tracking table entries, UTT(n). For example, each update tracking table entry may be set to an initial value that indicates that the corresponding lookup table entry has not yet been updated. In an embodiment, each update tracking table entry is set to an initial value of 0. In other embodiments, other initial values may be selected.

For example, in an embodiment, blocks 602 and 604 may be implemented according to the following sequence:

```
for p = 1:N
    LUT(p) = [1, 0]
    UTT(p) = 0
end
```

In block 606, an input data sample, X(k), (e.g., input data sample 114, FIG. 1) is received, stored, and/or delayed (e.g., by delay element 120 and/or delay element 144, FIG. 1) for later access. In addition, a lookup table index (e.g., lookup table index 160) for the received input data sample is determined, in block 608. In an embodiment, the lookup table index, i(k), is a function of the received input sample, or i(k)=f{X(k)}=|{I(k)+jQ(k)}|, as described previously. In an embodiment, the lookup table index, i(k), is provided to a gain generator (e.g., gain generator 142, FIG. 1), as well as being stored and/or delayed (e.g., by delay element 144, FIG. 1) for later access.

In block 610, two, consecutive lookup table entries, LUT($n_{floor}$) and LUT($n_{ceil}$), are identified based on the input data sample, X(k), or more specifically, based on the lookup table index, i(k). In addition, in block 612, an output gain, G(k), is calculated by performing a weighted interpolation process, as mentioned previously. The factional part, $i_{FRAC}(k)$, of the lookup table index, i(k), may used to determine a weighting to apply to each of the two, consecutive lookup table entries, LUT($n_{floor}$) and LUT($n_{ceil}$), during the interpolation process. In an embodiment, the output gain, G(k), is determined as:

$$G(k)=w_1(LUT(n_{floor}))+w_2(LUT(n_{ceil})),$$

where $w_1=1-i_{FRAC}(k)$ and $w_2=i_{FRAC}(k)$. During a first iteration of the method, LUT($n_{floor}$) and/or LUT($n_{ceil}$) may be the initial gains that were stored in block 602.

For example, assume that a lookup table (e.g., lookup table 150, FIG. 1) includes eight entries, n=1 . . . 8. Referring also to FIG. 2, each of eight magnitude thresholds 211, 212, 213, 214, 215, 216, 217, 218 may correspond to one of the eight entries in the lookup table. For example, a first magnitude threshold 211 may correspond to LUT(1), a second magnitude threshold 212 may correspond to LUT(2), and so on. In the illustrated example, at least the first five samples 210 have magnitudes that fall between the first and second magnitude thresholds 211, 212. Accordingly, for the first five samples 210, a lookup table gain may be based on an interpolation between the first and second lookup table entries, or LUT($n_{floor}$)=LUT(1) and LUT($n_{ceil}$)=LUT(2).

As mentioned previously, a previous gain value, G(previous), may be used in calculating an output gain, G(k), in an alternate embodiment. In such an embodiment, a weighted interpolation process may be performed to produce the output gain, G(k). For example, the output gain, G(k), may be determined as:

$$G(k)=w_1*A+w_2*B,$$

where $w_1=1-i_{FRAC}(k)$ and $w_2=i_{FRAC}(k)$. In an embodiment, a determination may be made whether at least one of the consecutive lookup table entries has not been updated, and if so, a previous gain, G(previous), may be used as at least one argument in the weighted interpolation process. For example, in an embodiment, when UTT($n_{floor}$) indicates that LUT($n_{floor}$) has been previously updated (e.g., UTT($n_{floor}$)> 0), then A=LUT($n_{floor}$). Conversely, when UTT($n_{floor}$) indicates that LUT($n_{floor}$) has not previously been updated (e.g., UTT($n_{floor}$)=0), then A=G(previous), in an embodiment. Similarly, when UTT($n_{ceil}$) indicates that LUT($n_{ceil}$) has been previously updated (e.g., UTT($n_{ceil}$)>0), then B=LUT($n_{ceil}$). Conversely, when UTT($n_{ceil}$) indicates that LUT($n_{ceil}$) has not previously been updated (e.g., UTT($n_{ceil}$)=0), then B=G (previous), in an embodiment.

In an embodiment in which G(previous) is maintained, the calculated output gain, G(k), may be stored as the previous gain, G(previous), by writing the output gain into the previous gain register (e.g., previous gain register 158, FIG. 1) or the memory location that stores G(previous), in an embodiment. In other words, G(previous) may be set to G(k). In an alternate embodiment, the previous gain register may store a value that is calculated from a combination of previous gains. In such an embodiment, G(previous) may be calculated using the output gain, G(k), and one or more other previous gains.

As discussed above, the output gain, G(k), may be stored as the previous gain, G(previous), by writing the output gain into the previous gain register, or G(previous)=G(k). In another embodiment, a value that is a function of the new values for the lookup table entries LUT($n_{floor}$) and LUT($n_{ceil}$) is written into the previous gain register (e.g., previous gain register 158, FIG. 1). For example, in an embodiment, G(previous) may be determined as:

$$G(previous)=w_1(LUT(n_{floor}))+w_2(LUT(n_{ceil})),$$

where $w_1=1-i_{FRAC}(k)$ and $w_2=i_{FRAC}(k)$. In still other embodiments, G(previous) may not be maintained.

In block 614, the stored or delayed input data sample, X(k), and the output gain, G(k), produced in block 612 are combined to produce a pre-distorted data sample (e.g., pre-distorted data sample 126, FIG. 1). The pre-distorted data sample, $X_p(k)$, may then be D-to-A converted, up-converted, and amplified, in block 616, to produce an amplified analog signal (e.g., amplified analog signal 132, FIG. 1) that may be further processed, stored, and/or transmitted by a transmit subsystem. In addition, in block 618, the amplified analog signal may be fed back (e.g., via feedback loop 108, FIG. 1), down-converted, and A-to-D converted (e.g., by down-converter 110), to produce a feedback sample, $X_d(k)$ (e.g., feedback sample 136, FIG. 1).

In block 620, an adjustment gain (e.g., adjustment gain 137, FIG. 1) may be applied to the feedback sample (e.g., feedback sample 136, FIG. 1). For example, as discussed previously, the adjustment gain and the feedback sample may be multiplied together (e.g., by adjustment gain application element 148, FIG. 1), to produce an adjusted feedback sample (e.g., adjusted feedback sample 138, FIG. 1). The adjustment gain may or may not be rotated, as was discussed previously, to effectively reduce the uncompensated-for insertion gain within the feedback signal.

In blocks 622, 624, and 626, several decisions may be made to determine whether or not to apply phase rotations to the adjustment gain. For example, in block 622, a determination may be made whether or not adjustment gain rotation is enabled, as discussed previously. For example, this determination may be made by a rotation control element (e.g., rotation control elements 460, 560, FIGS. 4 and 5). When adjustment gain rotation is disabled, then the method may bypass rotating the adjustment gain, as shown.

When adjustment gain rotation is enabled, a determination may be made, in block 624, whether or not a vector corresponding to an input/feedback phase difference indicator (e.g., input/feedback phase difference indicator 151, FIG. 1) is outside of a target phase region (e.g., target phase region 320, FIG. 3), as discussed previously. For example, this determination may be made by a phase sector evaluation element (e.g., phase sector evaluation elements 464, 564, FIGS. 4 and 5). When the vector corresponding to an input/feedback phase difference indicator is inside the target phase region, then the method may bypass rotating the adjustment gain, as shown.

When the vector corresponding to an input/feedback phase difference indicator is outside of the target phase region, then a determination may be made, in block 626, whether or not a magnitude of the input signal (e.g., input sample 114, FIG. 1) is greater than or less than a signal magnitude threshold, as discussed previously. For example, this determination may be made by a signal magnitude evaluation element (e.g., signal magnitude evaluation elements 462, 562, FIGS. 4 and 5). When the magnitude of the input signal is less than the signal magnitude threshold, then the method may bypass rotating the adjustment gain, as shown.

When the magnitude of the feedback signal exceeds the signal magnitude threshold, then LUT updates may be disabled, in block 628. For example, LUT updates may be disabled by an LUT update control element (e.g., LUT update control elements 470, 570, FIGS. 4 and 5) based on whether or not inverse signal gain rotation is enabled.

In block 630, a gain rotation angle or a gain rotation vector for application to the adjustment gain is produced. In an embodiment, such as the embodiment illustrated and described in conjunction with FIG. 4, a gain rotation angle may be produced for application to the adjustment gain. This may include producing an indicator of the phase offset between an input sample (e.g., input sample 114, FIG. 1) and a corresponding adjusted feedback sample (e.g., adjusted feedback sample 414, FIG. 4). For example, the indicator may be a rotated, adjusted feedback sample (e.g., rotated, adjusted feedback sample 432, FIG. 4). A Cartesian-to-polar transformation of the rotated, adjusted feedback sample may be performed by a system element (e.g., phase rotation element 440, FIG. 4), and the gain rotation angle may approximately equal the phase part of the polar representation of the rotated, adjusted feedback sample.

In another embodiment, such as the embodiment illustrated and described in conjunction with FIG. 5, a gain rotation vector may be produced, in block 630, for application to the adjustment gain. In an embodiment, this may include producing an indicator of the phase offset between an input sample (e.g., input sample 114, FIG. 1) and a corresponding adjusted feedback sample (e.g., adjusted feedback sample 514, FIG. 5). For example, the indicator may be a rotated, adjusted feedback sample (e.g., rotated, adjusted feedback sample 532, FIG. 5). The rotated, adjusted feedback sample may be evaluated (e.g., by phase sector calculator element 540, FIG. 5) to determine in which phase sector (e.g., in which of sectors 321-328, FIG. 3) a vector corresponding to the rotated, adjusted feedback sample is located. The phase sector determination may be used to identify a gain rotation vector (e.g., gain rotation vector 556) within a rotation vector table (e.g., Table 2 or 3, above).

In block 632, the adjustment gain is rotated by a gain rotation angle approximately equal to a phase offset between the input signal (e.g., input sample 114, FIG. 1) and the feedback signal (e.g., adjusted feedback sample 138, FIG. 1). In an embodiment, such as that illustrated and described in conjunction with FIG. 4, this may include applying the gain rotation angle produced in block 630 to the adjustment gain (e.g., adjustment gain 450 stored in adjustment gain register 442, FIG. 4). Rotation of the adjustment gain by the gain rotation angle may be performed, for example, by a phase rotation element (e.g., phase rotation element 440, FIG. 4), which may produce a rotated adjustment gain (e.g., rotated adjustment gain 452, FIG. 4). The rotated adjustment gain may be stored for later application to a feedback sample (e.g., feedback sample 410, FIG. 4).

In another embodiment, such as that illustrated and described in conjunction with FIG. 5, rotation of the adjustment gain by the gain rotation angle may include combining the adjustment gain (e.g., adjustment gain 550, FIG. 5) with a gain rotation vector (e.g., gain rotation vector 556, FIG. 5) produced in block 630. Combination of the adjustment gain with a gain rotation vector may be performed, for example, by a multiplier (e.g., multiplier 544, FIG. 5) to produce a rotated adjustment gain (e.g., rotated adjustment gain 558, FIG. 5). The rotated adjustment gain may be stored for later application to a feedback sample (e.g., feedback sample 510, FIG. 5). After rotating the adjustment gain, the method may iterate, as shown, for subsequent input data samples.

Referring back to blocks 622, 624, and 626, if either adjustment gain rotation is disabled (block 622), the vector corresponding to the input/feedback phase difference indicator is inside of the target phase region (block 624) or the magnitude of the feedback signal does not exceed the signal magnitude threshold (block 626), then the method proceeds to block 634, in which LUT updating may be enabled, if it is not already. For example, LUT updating may be enabled by an LUT update control element (e.g., LUT update control element 470, 570, FIGS. 4 and 5).

LUT updating may include calculating gain delta values and updated gains for one or more lookup table entries, as will be described below. In block 636, gain delta values, ΔLUT($n_{floor}$) and ΔLUT($n_{ceil}$), may be calculated. Includes calculating an error vector, E(k) (e.g., output vector 418, 518, FIG. 5). From the gain delta values, updated gains for the corresponding lookup table entries, LUT($n_{floor}$) and LUT($n_{ceil}$), may be calculated. For example, the updated gains may be calculated as LUT($n_{floor}$)=LUT($n_{floor}$)+ΔLUT($n_{floor}$) and LUT($n_{ceil}$)=LUT($n_{ceil}$)+ΔLUT($n_{ceil}$).

In block 638, the lookup table and update tracking table entries may be updated. In an embodiment, LUT($n_{floor}$) and LUT($n_{ceil}$) are updated with the updated gains calculated in block 636. The update tracking information within the update tracking table entries, UTT($n_{floor}$) and UTT($n_{ceil}$) may be updated, in an embodiment, to indicate that the lookup table entries, LUT($n_{floor}$) and LUT($n_{ceil}$), have been updated. For example, in an embodiment, the values within UTT($n_{floor}$) and UTT($n_{ceil}$) may be incremented by one. In another embodiment, when the update tracking table includes simple Boolean values, the values within UTT($n_{floor}$) and UTT($n_{ceil}$) may be modified simply to indicate that at least one update has occurred, if they have not already been so modified.

In an alternate embodiment, one or more lookup table entries that are considered to be "adjacent" to $LUT_{floor}$(k) and/or $LUT_{ceil}$(k) may be updated, under certain circumstances. To update adjacent lookup table entries, a determination may be made whether any one or more lookup table entries that are considered to be "adjacent" to $LUT_{floor}$(k) and/or $LUT_{ceil}$(k) have not been updated, in an embodiment. For example, in an embodiment, "adjacent" lookup table entries to $LUT_{floor}$(k) may be all lookup table entries having lower indices into the lookup table, and "adjacent" lookup table entries to $LUT_{ceil}$(k) may be all lookup table entries having higher indices into the lookup table. In another embodiment, an "adjacent" lookup table entry to $LUT_{floor}$(k) may be any one or more lookup table entries having a lower index into the lookup table, and an "adjacent" lookup table entry to $LUT_{ceil}$(k) may be any one or more lookup table entries having a higher index into the lookup table. In an embodiment, a determination of whether or not a particular, adjacent lookup table entry, LUT(n), has been updated may be determined by evaluating the update tracking information within the corresponding entry within the update tracking table, UTT(n). For example, UTT(n) may include a value that indicates whether or not LUT(n) has been updated, as discussed previously.

When one or more adjacent lookup table entries have not been updated, then the updated gains, LUT($n_{floor}$) and/or LUT($n_{ceil}$), may be written into at least some of the one or more, non-updated, adjacent lookup table entries. For example, this may be implemented according to the following sequence:

```
for p = 1:n_floor-1
    if UTT(p) == 0
        LUT(p) = LUT(n_floor)
    else
        do nothing
    end
end
for p = n_ceil+1:N
    if UTT(p) == 0
        LUT(p) = LUT(n_ceil)
    else
        do nothing
    end
end
```

In the embodiment described in the previous paragraph, the updated gains written into LUT($n_{floor}$) and/or LUT($n_{ceil}$), are also written into one or more of the adjacent lookup table entries that have not been updated at all. In another embodiment, the updated gains may be written into one or more adjacent lookup table entries that have been updated fewer than some threshold number of times. In an embodiment, a determination may be made whether an adjacent lookup table entry has been updated fewer than the threshold number of times. When the adjacent lookup table entry has been updated fewer than the threshold number of times, an updated gain may be written into the adjacent lookup table entry. In a particular embodiment, the threshold number of times may be a constant value, Y, or the threshold may be some other value. For example, this embodiment may be implemented according to the following sequence:

```
for p = 1:n_floor-1
    if UTT(p) <= Y
        LUT(p) = LUT(n_floor)
    else
        do nothing
    end
end
for p = n_ceil+1:N
    if UTT(p) <= Y
        LUT(p) = LUT(n_ceil)
    else
        do nothing
    end
end
```

In an embodiment, completion of block 638 completes the process of updating the lookup table and update tracking table for X(k). The method may then iterate, as shown, for subsequent input data samples.

It is to be understood that certain ones of the process blocks depicted in FIG. 6 may be performed in parallel with each other for a particular sample, X(k), and also in parallel with performing these processes for previous or subsequent samples. In addition, it is to be understood that the particular ordering of the process blocks depicted in FIG. 6 may be modified, while achieving substantially the same result. Further, inventive subject matter described in conjunction with FIG. 6 may be combined into a particular embodiment. Accordingly, such modifications are intended to be included within the scope of the inventive subject matter.

Embodiments of the inventive subject matter may include one or more additional or different processes and/or features. For example, although it may be advantageous to use embodiments of the inventive subject matter in systems that use actual data in conjunction with initially updating a lookup table, embodiments alternatively may be used in conjunction with systems that use training sequences to initially update the lookup table.

Embodiments described above have discussed signal processing based on values represented in Cartesian coordinates. Accordingly, digital signal processing carried out by the system may be performed using techniques appropriate for Cartesian coordinate calculations. In other embodiments, some values may be represented in polar coordinates or using other representations. It is to be understood that the scope of the inventive subject matter is intended to include embodiments in which digital signal processing carried out by the system may be performed using techniques appropriate for polar coordinate calculations or other types of calculations. Embodiments of the inventive subject matter may include other modifications, as well.

Thus, various embodiments of digital pre-distortion methods and apparatus have been described. A particular embodiment includes a method for performing digital pre-distortion in an electronic system. The method includes rotating an adjustment gain by a gain rotation angle to produce a rotated adjustment gain, where the gain rotation angle is based on a phase difference between an input signal and a feedback signal, and applying the rotated adjustment gain to the feedback signal.

In another embodiment, the method includes processing an input signal to produce a pre-distorted signal, processing the pre-distorted signal to produce a feedback signal, determining a phase difference between the input signal and the feedback signal, and applying an adjustment to the feedback signal, based on the phase difference, to rotate the feedback signal into a target phase region.

An embodiment of a digital pre-distortion apparatus, which is adapted to pre-distort an input signal, includes a first system element adapted to rotate an adjustment gain by a gain rotation angle to produce a rotated adjustment gain, where the gain rotation angle is based on a phase difference between the input signal and a feedback signal. The digital pre-distortion apparatus also includes a second system element, operatively coupled to the first system element, and adapted to apply the rotated adjustment gain to the feedback signal.

While the principles of the inventive subject matter have been described above in connection with specific systems, apparatus, and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method for performing digital pre-distortion in an electronic system, the method comprising the steps of:
   rotating an adjustment gain, which is output from an adjustment gain register, by a gain rotation angle to produce a rotated adjustment gain that is retained in the adjustment gain register, wherein the gain rotation angle is produced by a signal difference calculator based on a phase difference between an input signal to a transmit path of the electronic system and a feedback signal, which is fed back along a feedback path of the electronic system, and which wherein the feedback signal represents an upconverted, analog-converted, amplified, downconverted, and digitized version of the input signal, and wherein the adjustment gain is a complex value representing an inverse of one or more known gains applied to the input signal along the transmit path;
   applying, by an adjustment gain application element, the rotated adjustment gain to the feedback signal in the feedback path, wherein the rotated adjustment gain is output from the adjustment gain register; and
   the adjustment gain application element outputting the feedback signal to the signal difference calculator.

2. The method of claim 1, further comprising the steps of:
   processing an input data sample to produce a pre-distorted data sample;
   processing the pre-distorted data sample to produce a feedback sample;
   applying the adjustment gain to the feedback sample to produce an adjusted feedback sample; and
   producing the gain rotation angle based on a phase difference between the input data sample and the adjusted feedback sample, and
   wherein rotating the adjustment gain by the gain rotation angle is performed by rotating the adjustment gain by the gain rotation angle.

3. The method of claim 2, wherein producing the gain rotation angle comprises the steps of:
   rotating the adjusted feedback sample by a rotation angle approximately equal to a phase angle of the input data sample, to produce a rotated, adjusted feedback sample; and
   producing the gain rotation angle as a phase angle of the rotated, adjusted feedback sample.

4. The method of claim 1, further comprising the steps of:
   processing the input data sample to produce a pre-distorted data sample;
   processing the pre-distorted data sample to produce a feedback sample;
   applying the adjustment gain to the feedback sample to produce an adjusted feedback sample; and
   identifying a rotation vector based on a phase difference between the input data sample and the adjusted feedback sample, and
   wherein rotating the adjustment gain by the gain rotation angle is performed by combining the adjustment gain with the rotation vector.

5. The method of claim 4, wherein identifying the rotation vector comprises the steps of:
   determining a phase sector, from a plurality of phase sectors defined by the system, in which a vector corresponding to the phase difference between the input data sample and the adjusted feedback sample is located; and
   selecting the rotation vector from a rotation vector table based on the phase sector.

6. The method of claim 4, wherein identifying the rotation vector comprises the steps of:
   determining a phase sector, from a plurality of phase sectors defined by the system, in which a vector corresponding to the phase difference between the input data sample and the adjusted feedback sample is located; and
   selecting the rotation vector from a rotation vector table based on the phase sector, wherein the rotation vector has a value that will result in rotation of the feedback signal into a target phase region, when the rotation vector is applied to the adjustment gain, and when the rotated adjustment gain is applied to the feedback signal.

7. The method of claim 4, wherein identifying the rotation vector comprises the steps of:
   determining a phase sector, from a plurality of phase sectors defined by the system, in which a vector corresponding to the phase difference between the input data sample and the adjusted feedback sample is located;
   producing an index into a rotation vector table based on the phase sector; and
   selecting the rotation vector as the rotation vector stored within a rotation vector table entry that corresponds to the index.

8. The method of claim 1, further comprising the steps of:
determining whether at least one condition exists, which precludes rotating the adjustment gain; and
when the at least one condition exists, bypassing the step of rotating the system gain.

9. The method of claim 8, further comprising the steps of:
when the at least one condition does not exist, disabling updating a lookup table of the electronic system, wherein the lookup table includes multiple lookup table entries within which gain values are retained for application to the input signal.

10. The method of claim 1, further comprising the steps of:
determining whether a vector corresponding to a phase difference between the input signal and the feedback signal is located within a target phase region; and
when the vector is located within the target phase region, bypassing the step of rotating the system gain.

11. The method of claim 1, further comprising the steps of:
determining whether a magnitude of the input signal is greater than or less than a signal magnitude threshold; and
when the magnitude is less than the signal magnitude threshold, bypassing the step of rotating the system gain.

12. A method for performing digital pre-distortion in an electronic system, the method comprising the steps of:
processing an input signal along a transmit path of the electronic system to produce a pre-distorted signal, wherein the transmit path applies one or more known gains to the input signal;
processing the pre-distorted signal to produce a feedback signal, which is fed back along a feedback path of the electronic system, wherein the feedback signal represents an upconverted, analog-converted, amplified, downconverted, and digitized version of the input signal;
determining, by a signal difference calculator, a phase difference between the input signal and the feedback signal;
applying, by an adjustment gain application element, an adjustment gain to the feedback signal in the feedback path, wherein the adjustment gain is output from an adjustment gain register, the adjustment gain is a complex value representing an inverse of the one or more known gains, and the adjustment gain is rotated based on the phase difference, and wherein applying the adjustment gain results in the feedback signal being rotated into a target phase region; and
the adjustment gain application element outputting the feedback signal to the signal difference calculator.

13. The method of claim 12, wherein the target phase region includes a consecutive range of phases within about +45° and about −45°.

14. The method of claim 12, wherein the target phase region includes a consecutive range of phases within about +22.5° and about −22.5°.

15. The method of claim 12, further comprising:
determining whether a phase of the feedback signal is located within the target phase region; and
when the phase of the feedback signal is located within the target phase region, bypassing the step of applying the adjustment.

16. A digital pre-distortion apparatus adapted to pre-distort an input signal, the digital pre-distortion apparatus comprising:
a first system element adapted to rotate an adjustment gain, which is output from an adjustment gain register, by a gain rotation angle to produce a rotated adjustment gain that is retained in the adjustment gain register, wherein the gain rotation angle is produced by a signal difference calculator based on a phase difference between an input signal to a transmit path of the electronic system and a feedback signal, which is fed back along a feedback path of the electronic system, and which wherein the feedback signal represents an upconverted, analog-converted, amplified, downconverted, and digitized version of the input signal, and wherein the adjustment gain is a complex value representing an inverse of one or more known gains applied to the input signal along the transmit path; and
a second system element, operatively coupled to the first system element, and adapted to apply the rotated adjustment gain to the feedback signal in the feedback path, wherein the rotated adjustment gain is output from the adjustment gain register, and wherein the second system element is further adapted to output the feedback signal to the signal difference calculator.

17. The apparatus of claim 16, further comprising:
a phase rotation element, operatively coupled to the first system element, and adapted to produce an indicator of the phase difference by rotating the feedback signal by a rotation angle approximately equal to a phase of the input signal.

18. The apparatus of claim 16, wherein the first system element comprises:
a phase rotation element adapted to perform a Cartesian-to-polar transformation on a phase difference indicator, which indicates the phase difference between the input signal and the feedback signal, and wherein the phase rotation element is further adapted to produce the gain rotation angle as a negative of a phase part of a polar representation of the phase difference indicator, and to apply the gain rotation angle to the adjustment gain to produce the rotated adjustment gain.

19. The apparatus of claim 18, wherein the first system element further comprises:
an inverter adapted to produce a complex conjugate of the rotated adjustment gain;
a first element adapted to provide the complex conjugate as a first input to the phase rotation element, rather than providing the phase difference indicator; and
a second element adapted to provide a default gain as a second input to the phase rotation element, rather than providing the adjustment gain, wherein the phase rotation element produces the gain rotation angle based on the complex conjugate, and applies the gain rotation angle to the default gain to produce the rotated adjustment gain.

20. A digital pre-distortion apparatus adapted to pre-distort an input signal, the digital pre-distortion apparatus comprising:
a first system element adapted to rotate an adjustment gain by a gain rotation angle to produce a rotated adjustment gain, wherein the gain rotation angle is based on a phase difference between the input signal and a feedback signal, wherein the first system element comprises:
a phase sector calculator element adapted to determine a phase sector, from a plurality of phase sectors defined by the apparatus, in which a vector corresponding to the phase difference between the input signal and the feedback signal is located, and wherein the phase sector calculator is further adapted to produce an index into a rotation vector table, wherein the index corresponds to the phase sector, a table storage element, operatively coupled to the phase sector calculator, and adapted to store the rotation vector table, wherein the rotation vector table includes a plurality of entries, and wherein the table storage element is further adapted to produce a rotation vector stored within an entry that corresponds to the index, and a combiner, operatively coupled to the table storage element, and adapted to combine the rotation vector with the adjustment gain to produce the rotated adjustment gain; and a second system element, operatively coupled to the first system element, and adapted to apply the rotated adjustment gain to the feedback signal.

* * * * *